United States Patent
Yabuno et al.

[11] Patent Number: 5,914,969
[45] Date of Patent: Jun. 22, 1999

[54] DEVICE AND METHOD FOR ERROR CORRECTING CODING, AND DEVICE AND METHOD FOR ERROR CORRECTING DECODING

[75] Inventors: Hiroyuki Yabuno, Katano; Takashi Yumiba, Uji, both of Japan

[73] Assignee: Matsushita Electric Industrial Co., Ltd., Osaka, Japan

[21] Appl. No.: 08/849,388

[22] PCT Filed: Oct. 2, 1996

[86] PCT No.: PCT/JP96/02866

§ 371 Date: Jun. 3, 1997

§ 102(e) Date: Jun. 3, 1997

[87] PCT Pub. No.: WO97/13328

PCT Pub. Date: Apr. 10, 1997

[30] Foreign Application Priority Data

Oct. 3, 1995 [JP] Japan ................................. 7-255991

[51] Int. Cl.[6] .................................................. H03M 13/00
[52] U.S. Cl. ..................... 371/37.11; 371/37.6; 364/746.1
[58] Field of Search .............................. 371/37.4, 37.11, 371/37.12, 38.1, 39.1, 41, 43.6, 43.7; 364/746.1

[56] References Cited

U.S. PATENT DOCUMENTS

| | | | |
|---|---|---|---|
| 4,162,480 | 7/1979 | Berleycamp | 340/146.1 |
| 4,410,989 | 10/1983 | Berleycamp | 371/40 |
| 4,633,470 | 12/1986 | Welch et al. | 371/37.07 |
| 4,649,541 | 3/1987 | Lahmeyer | 371/37 |
| 4,907,233 | 3/1990 | Deutsch et al. | 371/37.4 |

FOREIGN PATENT DOCUMENTS 7-74655  3/1995  Japan .

OTHER PUBLICATIONS

Kuang Y. Liu, "Architecture for VLSI Design of Reed–Solomon Encoders", IEEE Transactions on Computers, vol. C–31, No. 2, pp. 170–175, Feb. 1982.

*Primary Examiner*—William Grant
*Assistant Examiner*—McDieunel Marc
*Attorney, Agent, or Firm*—Wenderoth, Lind & Ponack, L.L.P.

[57] ABSTRACT

A device for encoding an error correcting code for input data of natural number N bits per symbol, by using a Reed-Solomon code having elements on a Galois field $GF(2^N)$ having a number of elements of $2^N$. The ROM (14) is provided as product data storage device, after previously computes a plurality of product data on the Galois field between each of the input data and each of coefficients of a generator polynomial of the Reed-Solomon code, and the ROM (14) previously stores the plurality of product data with handling a plurality of b product data as one set for each address. The read control device (12, 13, 24–26, 28), in response to the input data, read out the plurality of product data stored in the ROM (14) in parallel with the plurality of b product data taken as one set, and thereafter write them selectively and sequentially into the natural number m storage units (20–22) via the exclusive OR computing units (15–18) and the bus selector (19). Input data is inputted to the ROM (14) sequentially, and then parity data are generated by the m storage units and outputted therefrom.

5 Claims, 15 Drawing Sheets

Fig.14

|     | S201 | S202 | S203 | S204 | S205 |     |     |     |     |     |
|-----|------|------|------|------|------|-----|-----|-----|-----|-----|
| R1  | 0 | $i_{000}$ | $d_{000}$ |   |   |   |   |   |   |   |
| R2  | 0 | $k_1 \cdot d_{000}$ | $p_{004}$ | $i_{001}$ | $d_{001}$ |   |   |   |   |   |
| R3  | 0 | $k_2 \cdot d_{000}$ | $p_{003}$ | $k_1 \cdot d_{001}$ | $p_{009}$ | $i_{002}$ | $d_{002}$ |   |   |   |
| R4  | 0 | $k_3 \cdot d_{000}$ | $p_{002}$ | $k_2 \cdot d_{001}$ | $p_{008}$ | $k_1 \cdot d_{002}$ | $p_{014}$ | $i_{003}$ | $d_{003}$ |   |
| R5  | 0 | $k_4 \cdot d_{000}$ | $p_{001}$ | $k_3 \cdot d_{001}$ | $p_{007}$ | $k_2 \cdot d_{002}$ | $p_{013}$ | $k_1 \cdot d_{003}$ | $p_{019}$ | $i_{004}$ | $d_{004}$ |
| R6  |   | $k_{11} \cdot d_{000}$ | $p_{000}$ | $k_4 \cdot d_{001}$ | $p_{006}$ | $k_3 \cdot d_{002}$ | $p_{012}$ | $k_2 \cdot d_{003}$ | $p_{018}$ | $k_1 \cdot d_{004}$ | $p_{024}$ |
| R7  |   | ⊕ | $k_5 \cdot d_{001}$ | $p_{005}$ | $k_4 \cdot d_{002}$ | $p_{011}$ | $k_3 \cdot d_{003}$ | $p_{017}$ | $k_2 \cdot d_{004}$ | $p_{023}$ |
| R8  |   |   | ⊕ | $k_5 \cdot d_{002}$ | $p_{010}$ | $k_4 \cdot d_{003}$ | $p_{016}$ | $k_3 \cdot d_{004}$ | $p_{022}$ |
| R9  |   |   |   | ⊕ | $k_5 \cdot d_{003}$ | $p_{015}$ | $k_4 \cdot d_{004}$ | $p_{021}$ |
| R10 |   |   |   |   | ⊕ | $k_5 \cdot d_{004}$ | $p_{020}$ |
| R11 |   |   |   |   |   | ⊕ |

Column No.

DEVICE AND METHOD FOR ERROR CORRECTING CODING, AND DEVICE AND METHOD FOR ERROR CORRECTING DECODING

TECHNICAL FIELD

The present invention relates to device and method for error correcting coding, as well as device and method for error correcting decoding. In particular, the invention relates to device and method for error correcting coding for encoding error correcting codes for correcting errors in digital data during the recording or reproduction, or transmission or reception of digital data executed by digital recording equipment or digital communication equipment similar devices, and also relates to device and method for error correcting decoding for decoding error correcting codes.

BACKGROUND ART

In recent years, with the development of digital recording equipment and digital communication equipment, an important issue has been raised on how errors of digital data are reduced during the recording or reproduction, or transmission or reception of digital data. Thus, for correction of errors of digital data, error correcting codes are used in various types of equipments that treat digital data. The Reed-Solomon code is also one type of such error correcting codes, and is used primarily in, for example, digital recording devices such as PD drive units utilizing phase change.

The Reed-Solomon code is a multi-element cyclic Hamming code in which the code word consists of elements of a Galois field $GF(2^N)$ whose number of elements is $2^N$, and in which if $\alpha$ is the primitive element of $GF(2^N)$, then the generator polynomial can be expressed by the following equation:

$$G(X)=(X-\alpha^0)(X-\alpha^1)\ldots(X-\alpha^{d-2}) \tag{1}$$

Hereinafter, computational operations including the Equation (1) will be all executed on the Galois field $GF(2^N)$. Also, d denotes the minimum inter-code distance.

Code words in the Reed-Solomon code are generated as follows:

If an information word vector I is expressed as follows:

$$I=(i_0, i_1, \ldots, i_{k-1}) \tag{2}$$

then the information polynomial I(X) can be expressed as follows:

$$I(X)=i_0 \cdot X^{k-1}+i_1 \cdot X^{k-2}+\ldots+i_{k-2} \cdot X+i_{k-1} \tag{3}$$

where $i_0, i_1, \ldots$ and $i_{k-1}$ are information symbols, respectively, and are associated with vector representations of elements on the Galois field $GF(2^N)$ by handling N bits as one set with respect to bit data that are the source of information.

Then, a code polynomial A(X) can be calculated from the information polynomial I(X) and the generator polynomial G(X) by using the following equation:

$$A(X)=I(X) \cdot G(X) \tag{4}$$

However, the code obtained would not be a systematic code. Therefore, a code word is created as follows.

First of all, the information polynomial I(X) is multiplied by $X^{n-k}$, and the result is divided by G(X). If the quotient is Q(X) and the remainder is R(X), then the following expression can be given:

$$I(X) \cdot X^{n-k} = Q(X) \cdot G(X) + R(X) \tag{5}$$

Then, if $$A(X)=R(X)+I(X) \cdot X^{n-k} \tag{6}$$

then the following equation can be obtained from the Equation (5):

$$A(X)=Q(X) \cdot G(X) \tag{7}$$

The A(X) calculated by the Equation (7) is divisible by the generator polynomial G(X), thus resulting in a code polynomial. If the code polynomial R(X) is expressed as follows:

$$R(X)=r_0 \cdot X^{n-k-1}+r_1 \cdot X^{n-k-2}+\ldots+r_{n-k-2} \cdot X+r_{n-k-1} \tag{8}$$

then the code polynomial A(X) expressed by the Equation (6) can be expressed as follows:

$$A(X) = i_0 \cdot X^{n-1} + i_1 \cdot X^{n-2} + \cdots + \tag{9}$$
$$i_{k-2} \cdot X^{n-k+1} + i_{k-1} \cdot X^{n-k} +$$
$$r_{n-k-1} \cdot X^{n-k-1} + r_{n-k-2} \cdot X^{n-k-2} + \cdots + r_1 \cdot X + r_0$$

The code word represented by the code polynomial of the Equation (9) can be represented in vector representation as follows:

$$A=(i_0, i_1, \ldots, i_{k-1}, i\ r_0, r_1, \ldots, r_{n-k-1}) \tag{10}$$

where the code word vector A represented by the Equation (10) contains the information word vector I as it is, proving that it is a systematic code. In this case, the code word vector A is a (n, k) systematic code. Upon creating a code word, a vector R to be added to the information word vector, that is, $$R=(r_0, r_1, \ldots, r_{n-k-1}) \tag{11}$$

is a parity vector.

The code generated in this way as shown above is written as a Reed-Solomon code RS (n, k, d=n−k+1).

FIG. 12 shows an example of the device for error correcting coding according to the prior art using the Reed-Solomon code. This circuit performs the division of polynomials having coefficients of Galois field $GF(2^N)$ Referring to FIG. 12, the device for error correcting coding comprises:

(a) 8-bit EXCLUSIVE-OR computing units 195 to 206;

(b) coefficient multipliers 171 to 182 having coefficients $k_{12}$ to $k_1$ on the Galois field;

(c) 8-bit latches 183 to 194; and (d) an initial-value setting circuit 207 for clearing to 0 the contents of the 8-bit latches 183 to 194 upon a reset.

In this device for error correcting coding, input data is inputted to a first input terminal of the EXCLUSIVE-OR computing unit 206. The output data from the output terminal of the EXCLUSIVE-OR computing unit 206 is inputted to the 8-bit latch 183 via the coefficient multiplier 171, while the output data therefrom is inputted to the EXCLUSIVE-OR computing units 195 to 205 via the coefficient multipliers 172 to 182, respectively. Further, the 8-bit latches 183 to 194 and the EXCLUSIVE-OR computing units 195 to 206 are arranged alternately and connected in series so that data is transferred from the latch 183 toward the latch 194.

Next, a case where a Reed-Solomon code RS (32, 20, d=13) with 8 bits taken as 1 symbol is actually encoded by using the device for error correcting coding of FIG. 12.

It is noted that the primitive polynomial m(X), the primitive element $\alpha$ and the generator polynomial G(X) are defined as follows:

$$m(X) = X^8 + X^4 + X^3 + X^2 + 1 \quad (12)$$

$$\alpha(00000010) \quad (13)$$

$$G(X) = \prod_{i=0}^{11}(X - \alpha^i) \quad (14)$$

$$= k_1 \cdot X^{11} + k_2 \cdot X^{10} + \cdots + k_{11} \cdot X + k_{12}$$

In addition, $k_1$ to $k_{12}$ in the Equation (14) represent coefficients to be multiplied to $X^{11}$ to $X^0$, as a result of developing the generator polynomial G(X) and arraying the terms in the descending order of X.

When a first information symbol $i_{000}$, which is first input data, is inputted to the EXCLUSIVE-OR computing unit 206, an EXCLUSIVE-OR of the first information symbol $i_{000}$ and 00H, which is the output data from the 8-bit latch 194, is computed, and then, data of the computation result is inputted to the Galois field coefficient multipliers 171 to 182. It is noted that "H" in 00H denotes a hexadecimal representation, which is the case also hereinafter. In this case, if the data inputted to the Galois field coefficient multipliers 171 to 182 is $d_{000}$, then the data $d_{000}$, which is the EXCLUSIVE-OR of the first information symbol $i_{000}$ and the data of 00H can be expressed by the following equation:

$$d_{000} = i_{000} \quad (15)$$

This corresponds to a computation which presents in column number R1 and over three rows of step S101 of FIG. 13. Next, the Galois field coefficient multipliers 171 to 182 output products on the Galois field of the input data $d_{000}$ and their respective coefficients $k_{12}$ to 1. These products correspond to the data which present in column numbers R13 to R2 and on the second row of step S101 of FIG. 13.

Next, the output data from the Galois field coefficient multipliers 171 to 182 are stored in the 8-bit latches 183 to 194, respectively. Now the data stored in the respective latches 183 to 194 are referred to as $p_{000}$ to $p_{011}$, respectively, these data values correspond to results of performing computations which present in column numbers R13 to R2 and over the three rows of step S101 of FIG. 13, respectively. In addition, the addition sign in FIG. 13 represents an EXCLUSIVE-OR operation, and hereinafter an operation EOR represents an EXCLUSIVE-OR operation.

Next, when a second information symbol $i_{001}$, which is second input data, is inputted to the EOR computing unit 206, an EOR of the second information symbol $i_{000}$ and $p_{011}$, which is output data from the 8-bit latch 194, is computed, and then, data of the computation result is inputted to the Galois field coefficient multipliers 171 to 182. In this case, if the data inputted to the Galois field coefficient multipliers 171 to 182 is $d_{001}$, then the data $d_{001}$, which is the EOR of the second information symbol $i_{001}$ and the data $p_{011}$ can be expressed by the following equation:

$$d_{001001} + p_{001} \quad (16)$$

This corresponds to a computation which presents in column number R2 and over three rows of step S101 of FIG. 13. Next, the Galois field coefficient multipliers 171 to 182 output products on the Galois field of the input data $d_{001}$ and their respective coefficients $k_{12}$ to $_1$. These products correspond to the data which presents in column numbers R14 to R3 and on the second row of step S102 of FIG. 13.

Next, the output data from the Galois field coefficient multipliers 171 to 182 are stored in the 8-bit latches 183 to 194, respectively. Now the data stored in the latches 183 to 194 are referred to as $p_{012}$ to $p_{023}$, respectively, these data values correspond to results of performing computations which present in column numbers R14 to R3 and over the three rows of step S102 of FIG. 13, respectively.

Likewise also for the following, as the information symbol $i_{002}$ through information symbol $i_{019}$ are inputted to the EOR computing unit 206, computations as shown in FIG. 13 are continued, and finally, parity words ($p_{228}, p_{229}, \ldots, p_{229}$) which are remainders of dividing the information words ($i_{000}, i_{001}, \ldots, i_{019}$) by the generator polynomial (the Equation (14)), are stored in the 8-bit latches 183 to 194, respectively. Adding the finally obtained parity symbols $p_{228}, p_{229}, \ldots$, and $p_{239}$ in succession to the information symbols $i_{000}, i_{001}, \ldots$, and $i_{019}$ that have already been inputted completes a code word ($i_{000}, i_{001}, \ldots, i_{019}, p_{228}, p_{229}, \ldots, p_{239}$).

However, in the device for error correcting coding as shown in FIG. 12, because the Galois field coefficient multipliers 171 to 182 have complex circuits, respectively, a large-scale circuit would be involved in encoding symbols of a long minimum inter-code distance. Also, for the device for error correcting coding as shown in FIG. 12, it would be difficult to change the minimum inter-code distance without changing the arrangement of the device. In order to change the minimum inter-code distance without changing the arrangement of the device, it is necessary to make the coefficients of the Galois field coefficient multipliers changeable without changing the arrangement of the device and to provide a circuit configuration that allows the loop of division circuits to be changed without changing the arrangement of the device. The implementation of these needs would result in further complex circuits.

A first object of the present invention is to provide a device and method for error correcting coding which solves the above-mentioned problems, and which can be implemented with small-scale circuitry, as compared with that of the prior art, while fulfilling a practicable coding rate, and further which allows the minimum inter-code distance d to be freely changed without changing the arrangement of the device.

A second object of the present invention is to provide a device and method for error correcting decoding which can be implemented with small-scale circuitry, as compared with the prior art, while fulfilling a practicable decoding rate, and further which allows the minimum intercode distance d to be freely changed without changing the arrangement of the device.

DISCLOSURE OF THE INVENTION

According to the present invention, there is provided a device for error correcting coding for encoding an error correcting code for input data of natural number N bits per symbol, by using a Reed-Solomon code having elements on a Galois field $GF(2^N)$ having a number of elements of $2^N$, the device comprising:

product data storage device for previously storing a plurality of product data on the Galois field between each of the input data and each of coefficients of a generator polynomial of the Reed-Solomon code, with handling a plurality of b product data as one set for each address, after previously computing the plurality of product data;

first storage device comprising a natural number of m storage units each having a storage capacity of N×b bits;

read control device for controlling said product data storage device to read out the plurality of product data stored in said product data storage device in parallel by handling a plurality of b product data as one set, in response to the input data;

exclusive OR operation device having first and second input terminals each of N×b bits, the plurality of b product data read out in parallel from the product data storage device by said read control device being inputted to the first input terminal, the exclusive OR operation device computing exclusive OR data between data inputted to the first input terminal and data inputted to the second input terminal, and outputting resulting computation data;

first selecting device for controlling the first storage device to selectively and sequentially read out and output data stored in the m storage units every one storage unit thereof, to output data of more significant N×(b−1) bits out of the selectively read out and outputted data of N×b bits, to less significant N×(b−1) bits of the second input terminal of the exclusive OR operation device, and to write the resulting computation data outputted from the exclusive OR operation device into one of the m storage units by selectively and sequentially switching the m storage units; and second storage device having a storage capacity of N bits, for temporarily storing data of the less significant N bits out of the N×b bit data selectively outputted from one of the m storage units by the first selecting device, and for outputting temporarily stored data to the more significant N bits of the second input terminal of the exclusive OR operation device, wherein when sequentially inputting the input data into the product data storage device, the m storage unit of the first storage device generates parity data, wherein the device further comprises:
second selecting device for sequentially outputting the respective parity data generated by the m storage units by selectively and sequentially switching the m storage units every one storage unit in succession to the input data.

Further, in the above-mentioned device for error correcting coding, the read control device, the first selecting device and the second selecting device are preferably implemented by a central processing unit for executing a predetermined program stored in a further storage unit.

Further, according to the present invention, there is provided a device for error correcting decoding for decoding an error correcting code for input data of natural number N bits per symbol, by using a Reed-Solomon code having elements on a Galois field GF($2^N$) having a number of elements of $2^N$, the device comprising:

received word storage device for storing an input received word comprised of a plurality of received symbols including input data and parity data associated with the input data, in a unit of the received symbols;

remainder computing device comprising the device for error correcting coding as claimed in Claim 1, the remainder computing device computing and outputting a remainder for the input received word by using a generator polynomial of the Reed Solomon code;

error numerical value and error position computing device for computing and outputting a set of an error position in the received word and an error numerical value corresponding to the error position, based on the remainder outputted from the remainder computing device;

control device for reading out from said received word storage device and outputting a received symbol in the error position stored in the received word storage device based on the error position in the received word outputted from the error numerical value and error position computing device;

exclusive OR operation device for computing exclusive OR data between the received symbol in the error position outputted from the read control device and the error numerical value corresponding to the error position outputted from the error numerical value and error position computing device, and outputting resulting computation data; and write control device for writing the resulting computation data outputted from the exclusive OR operation device into the error position in the received word storage device, and for correcting the received symbol in the error position.

Furthermore, according to the present invention, there is provided a method for error correcting coding for encoding an error correcting code for input data of natural number N bits per symbol, by using a Reed-Solomon code having elements on a Galois field GF($2^N$) having a number of elements of $2^N$, the method including the following steps of:

previously storing in a product data storage device a plurality of product data on the Galois field between each of the input data and each of coefficients of a generator polynomial of the Reed-Solomon code, with handling a plurality of b product data as one set for each address, after previously computing the plurality of product data;

controlling the product data storage device to read out the plurality of product data stored in the product data storage device in parallel by handling a plurality of b product data as one set, in response to the input data;

by using exclusive OR operation device having first and second input terminals each of N×b bits, the plurality of b product data read out in parallel from the product data storage device by the read control device being inputted to the first input terminal, computing exclusive OR data between data inputted to the first input terminal and data inputted to the second input terminal, and outputting resulting computation data;

controlling the first storage device comprising m storage unit each having a storage capacity of N×b bits, to selectively and sequentially read out and output data stored in said m storage units every one storage unit thereof, to output data of more significant N×(b−1) bits out of the selectively read out and outputted data of N×b bits, to less significant N×(b−1) bits of the second input terminal of the exclusive OR operation device, and to write the resulting computation data outputted from said exclusive OR operation device into one of the m storage units by selectively and sequentially switching the m storage units;

by using second storage device having a storage capacity of N bits, temporarily storing data of the less significant N bits out of the N×b bit data selectively outputted from one of the m storage units, and outputting temporarily stored data to the more significant N bits of the second input terminal of the exclusive OR operation device;

when sequentially inputting the input data into the product data storage device, generating parity data in the m storage unit of said first storage device; and sequentially outputting the respective parity data generated by the m storage units by selectively and sequentially switching the m storage units every one storage unit in succession to the input data.

Still further, according to the present invention, there is provided a method for error correcting decoding for decoding an error correcting code for input data of natural number N bits per symbol, by using a Reed-Solomon code having elements on a Galois field GF($2^N$) having a number of elements of $2^N$, the method including the following steps of:

storing in a received word storage device an input received word comprised of a plurality of received symbols including input data and parity data associated with the input data, in a unit of the received symbols;

by the method for error correcting coding as claimed in Claim 4, computing and outputting a remainder for the input received word by using a generator polynomial of the Reed Solomon code;

computing and outputting a set of an error position in the received word and an error numerical value corresponding to the error position, based on the outputted remainder;

reading out from the received word storage device and outputting a received symbol in the error position stored in the received word storage device based on the error position in the outputted received word;

computing exclusive OR data between the received symbol in the outputted error position and the error numerical value corresponding to the outputted error position, and outputting resulting computation data; and writing the outputted resulting computation data into the error position in the received word storage device, and correcting the received symbol in the error position.

BRIEF DESCRIPTION OF THE DRAWINGS

FIG. 14 is a chart for explaining the way of calculating a Reed-Solomon code RS (n, n–5, d=6) in the device for error correcting coding of FIG. 12.

BEST MODE FOR CARRYING OUT THE INVENTION

Preferred embodiments of the present invention will be described hereinbelow with reference to the accompanying drawings.

FIRST PREFERRED EMBODIMENT

A first preferred embodiment according to the present invention will be described with reference to the accompanying drawings. The first preferred embodiment will be described on a case where a Reed-Solomon code RS (32, 20, d=13) with 8 bits taken as 1 symbol is encoded. It is noted that the primitive polynomial m(X), the primitive element α and the generator polynomial G(X) are defined as shown by the Equation (12), the Equation (13) and the Equation (14), respectively.

Figure 1:
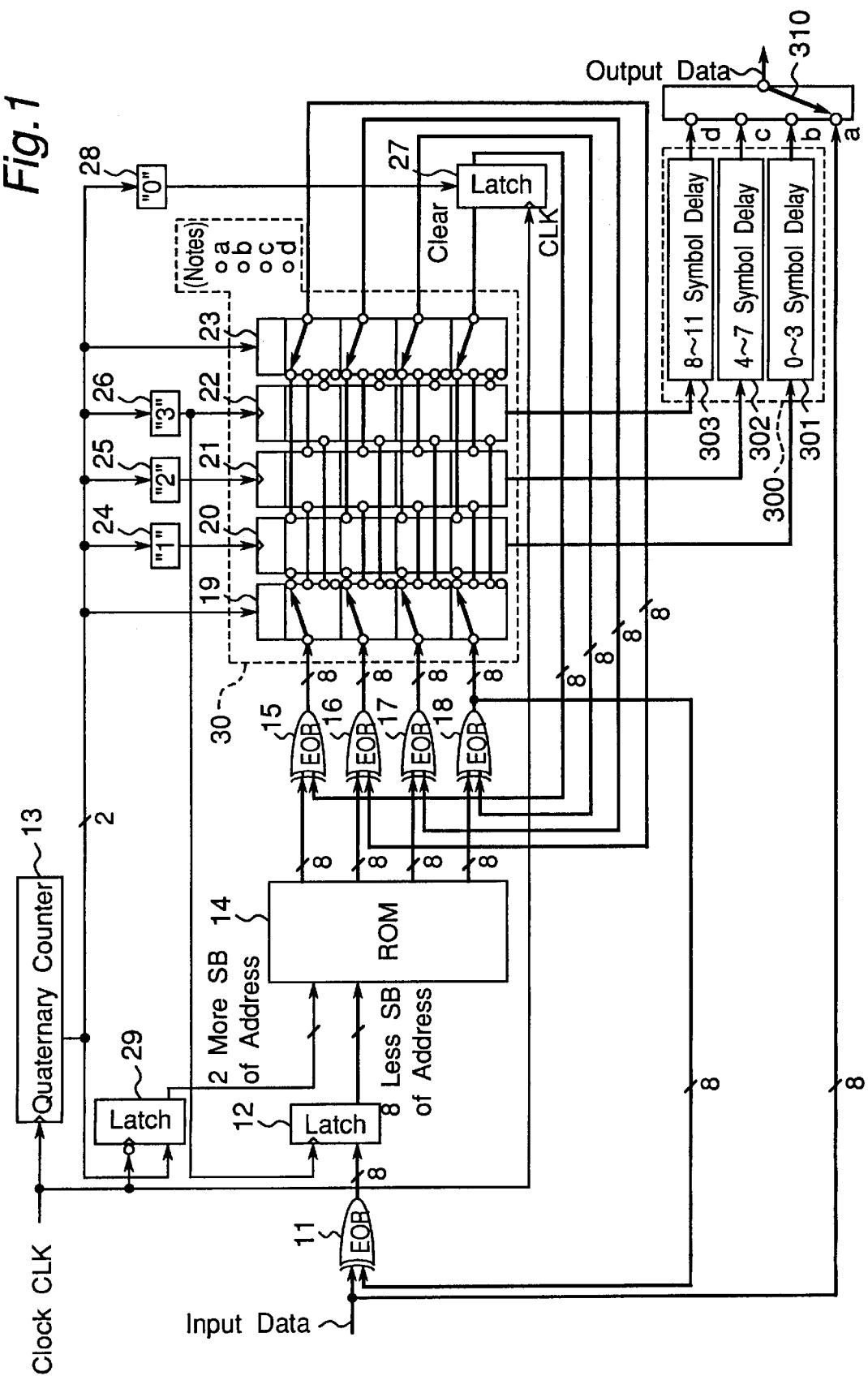
FIG. 1 is a block diagram of a device for error correcting coding of a first preferred embodiment according to the present invention.

FIG. 1 is a block diagram showing an arrangement of a device for error correcting coding of the first preferred embodiment according to the present invention. The device for error correcting coding of this first preferred embodiment comprises:

(a) 8-bit latches 12 and 27;

(b) a quaternary counter 13;

(c) a ROM (Read-Only Memory) 14;

(d) 8-bit EOR computing units 11, 15, 16 and 17 and 18;

(e) 32-bit bus selectors 19 and 23;

(f) a queue memory 30 comprising 32-bit latches 20, 21 and 22;

(g) a decoder 24 for decoding an input data "1" to output a pulse signal;

(h) a decoder 25 for decoding an input data "2" to output a pulse signal;

(i) a decoder 26 for decoding an input data "3" to output a pulse signal;

(j) a decoder 28 for decoding an input data "0" to output a pulse signal;

(k) a 2-bit latch 29;

(l) a delay circuit 300 comprising three symbol delay circuits 301 to 303; and (m) an 8-bit output data selector 310.

In the device for error correcting coding of FIG. 1, 8-bit input data is inputted to a first input terminal of the EOR computing unit 11, while the 8-bit input data is outputted via the d-contact of the output data selector 310 as output data. The output data from the output terminal of the EOR computing unit 18 is inputted to a second input terminal of the EOR computing unit 11. On the other hand, a clock CLK is inputted to both the quaternary counter 13 and the latches 29 and 27. The quaternary counter 13, which counts the inputted clock CLK, is reset to 0 when the count value has reached 4, and outputs 2-bit data of the count value to an address terminal of the ROM 14 via the latch 29 as an address for the more significant 2 bits, while the quaternary counter 13 also outputs the data to both the bus selectors 19 and 23 and the decoders 24, 25, 26 and 28 as a select signal. It is noted that the 2-bit latch 29 latches 2-bit data of the count value of the quaternary counter 13 at a timing of the trailing edge of the clock CLK.

When the output data from the quaternary counter 13 represents a value of "0", the decoder 28 outputs to the latch 27 a pulse signal having a width of a half cycle of the clock CLK with a time delay of a half cycle of the clock CLK. Also, when the output data from the quaternary counter 13 represents a value of "1", the decoder 24 outputs to the latch 20 a pulse signal having a width of a half cycle of the clock CLK with a time delay of a half cycle of the clock CLK. Further, when the output data from the quaternary counter 13 represents a value of "2", the decoder 25 outputs to the latch 21 a pulse signal having a width of a half cycle of the clock CLK with a time delay of a half cycle of the clock CLK. Still further, when the output data from the quaternary counter 13 represents a value of "3", the decoder 26 outputs to the latch 22 a pulse signal having a width of a half cycle of the clock CLK with a time delay of a half cycle of the clock CLK.

The 8-bit latch 12 latches 8-bit data derived from the EOR computing unit 11 at a timing of the leading edge of the clock CLK of the pulse signal derived from the decoder 26, and outputs the latched data to the ROM 14 as an address for the less significant 8 bits. The ROM 14 has previously stored results of multiplying input symbols in vector representation by predetermined coefficients on the Galois field in the form of vector representation. Input data is given as less significant 8 bits of the address, while the significant 2 bits of the address are used for changing coefficients. The 32-Bit output data from data terminals of the ROM 14 are inputted to first input terminals of respective four EOR computing units 15 to 18, and the 32-bit data outputted from their output terminals are inputted to input terminals of the bus selector 19. Also, the 8-bit output data outputted from the EOR computing unit 18 is inputted to a second input terminal of the EOR computing unit 11.

The 32-bit bus selectors 19 and 23 are bus selectors for interlocking four 8-bit buses to switch them into four circuits, respectively. The 32-bit bus selectors 19 and 23 are switched to the d-contact in the bottom position thereof when the select signal is "0", where the input terminals of the bus selector 19 and the output terminals of the bus selector 23 come to open states, respectively. Also, the 32-bit bus selectors 19 and 23 are switched to the a-contact in the top position thereof when the select signal is "1", and the input terminals of the bus selector 19 are connected to input buses of the 32-bit latch 20 while the bus selector 23 is connected output buses of the 32-bit latch 20. Further, the 32-bit bus selectors 19 and 23 are switched to the b-contact in the second uppermost position when the select signal is "2", and the input terminals of the bus selector 19 are connected to input buses of the 32-bit latch 21 while the bus selector 23 is connected to output buses of the 32-bit latch 21. Still further, the 32-bit bus selectors 19 and 23 are switched to the c-contact in the third uppermost position when the select signal is "3", and the input terminals of the bus selector 19 are connected to input buses of the 32-bit latch 22 while the bus selector 23 is connected to output buses of the 32-bit latch 22.

The data of the more significant 24 bits out of 32-bit output data outputted from the bus selector 23 are inputted to second input terminals of the EOR computing units 17, 18 and 19, while the data of the less significant 8 bits out of 32-bit output data outputted from the bus selector 23 are inputted to the second input terminal of the EOR computing unit 15 via the 8-bit latch 27. The 8-bit latch 27 latches the input 8-bit data at a timing of the leading edge of the clock CLK, and then outputs the latched data to the second input terminal of the EOR computing unit 15, and further clears to 0 the latched data in response to a pulse signal derived from the decoder 28.

The 32-Bit output data outputted from the 32-bit latch 20 is inputted to the symbol delay circuit 301. Then, among the inputted 32-bit data, the symbol delay circuit 301 operates:

(a) to output, as output data, the more significant 8 bit data via the b-contact of the 8-bit bus selector 310 without any delay in succession to the information symbols outputted from the a-contact of the bus selector 310 (the output timing of this output data being referred to as a reference output timing hereinafter);

(b) to output, as output data, the next more significant 8 bit data via the b-contact of the 8-bit bus selector 310 after a delay of 1 symbol (=1 byte=8 bits) from the reference output timing;

(c) to output, as output data, the further next more significant 8 bit data via the b-contact of the 8-bit bus selector 310 after a delay of 2 symbols from the reference output timing; and (d) to output, as output data, the succeeding less significant 8 bit data via the b-contact of the 8-bit bus selector 310 after a delay of 3 symbols from the reference output timing.

Also, the 32-bit output data outputted from the 32-bit latch 21 is inputted to the symbol delay circuit 302. Then, among the inputted 32-bit data, the symbol delay circuit 302 operates:

(a) to output, as output data, the more significant 8 bit data via the c-contact of the 8-bit bus selector 310 after a delay of 4 symbols from the reference output timing;

(b) to output, as output data, the next more significant 8 bit data via the c-contact of the 8-bit bus selector 310 after a delay of 5 symbols from the reference output timing;

(c) to output, as output data, the further next more significant 8 bit data via the c-contact of the 8-bit bus selector 310 after a delay of 6 symbols from the reference output timing; and (d) to output, as output data, the succeeding less significant 8 bit data via the c-contact of the 8-bit bus selector 310 after a delay of 7 symbols from the reference output timing.

Further, the 32-bit output data outputted from the 32-bit latch 22 is inputted to the symbol delay circuit 303. Then, among the inputted 32-bit data, the symbol delay circuit 303 operates:

(a) to output, as output data, the more significant 8 bit data via the d-contact of the 8-bit bus selector 310 after a delay of 8 symbols from the reference output timing;

(b) to output, as output data, the next more significant 8 bit data via the d-contact of the 8-bit bus selector 310 after a delay of 9 symbols from the reference output timing;

(c) to output, as output data, the further next more significant 8 bit data via the d-contact of the 8-bit bus selector 310 after a delay of 10 symbols from the reference output timing; and (d) to output, as output data, the succeeding less significant 8 bit data via the d-contact of the 8-bit bus selector 310 after a delay of 11 symbols from the reference output timing.

Accordingly, in succession to information symbols, for example, 20 symbols that are inputted to the device for error correcting coding, a parity word of 32 bits=4 symbols that have been encoded for error correction and stored in the latch 20, a parity word of 32 bits=4 symbols that have been encoded for error correction and stored in the latch 21 and a parity word of 32 bits=4 symbols that have been encoded for error correction and stored in the latch 22 are outputted from the bus selector 310 as output data.

Figure 2:
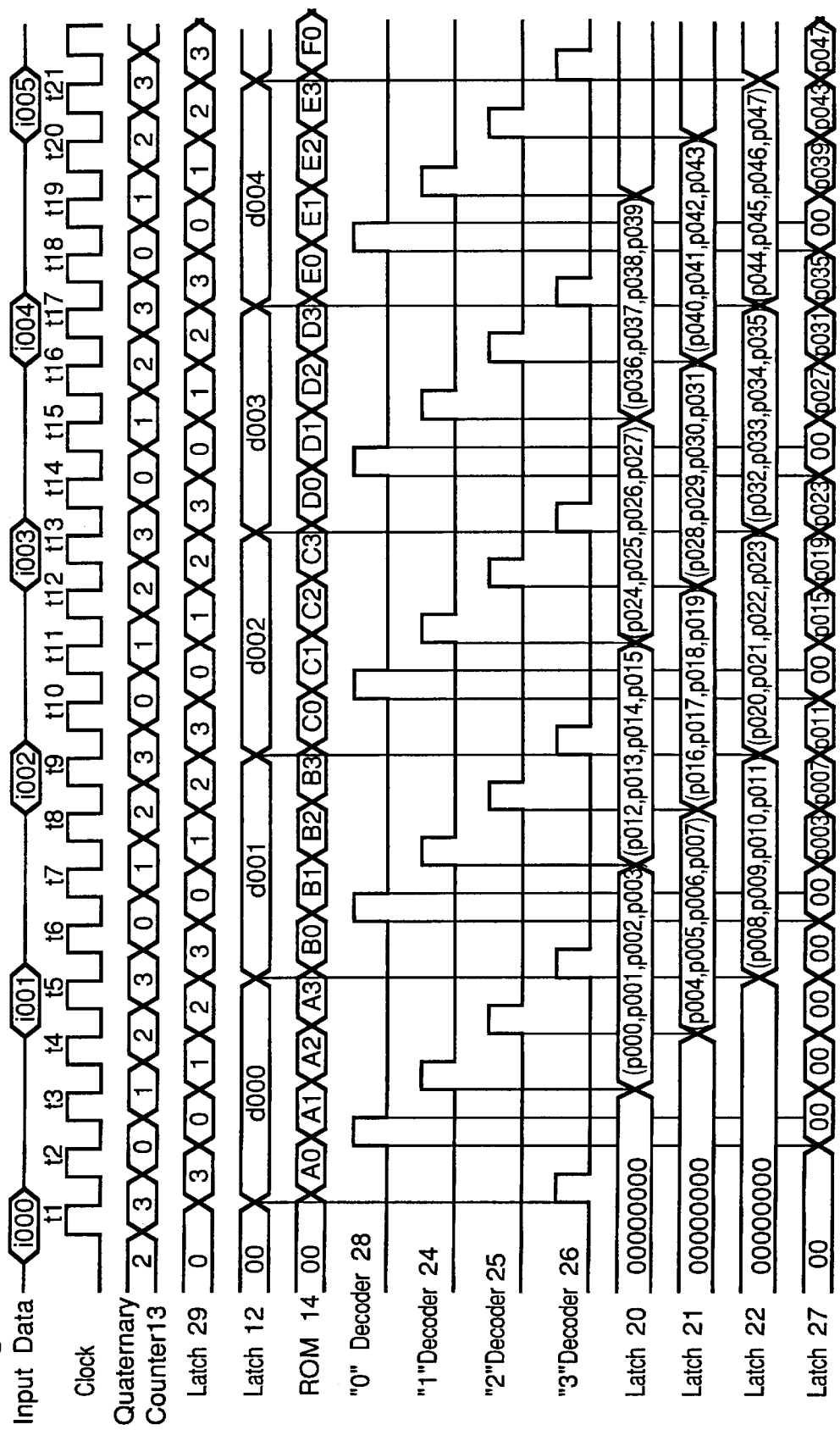
FIG. 2 is a timing chart showing an operation of the device for error correcting coding of FIG. 1.

FIG. 2 is a timing chart showing an operation of the device for error correcting coding of FIG. 1. Input data of 8 bits is inputted once every four pulses of the clock CLK. The quaternary counter 13 is set to an initial value of 2, the 8-bit latches 12 and 27 and the 32-bit latches 20, 21 and 22 are set to an initial value of 0, and the 2-bit latch 29 is set to an initial value of 0.

Tables 1 and 2 show the contents of data to be stored in the ROM 14. Referring to Tables 1 and 2, $k_1$ to $k_{12}$ denote coefficients of the generator polynomial G(X) shown in the Equation (14), $\alpha$ is the primitive element of Galois field $GF(2^8)$, and the product sign represents a product on the Galois field. The $k_m$, $\alpha^n$ (where m is a natural number of 1 to 12 and n is an integer equal to or larger than 0) are elements of the Galois field $GF(2^8)$. Therefore, products of $k_m$ and $\alpha^n$ are also elements of the Galois field $GF(2^8)$ and, since their vector representations correspond to 8-bit numerical values, respectively, the numerical value data of the products are previously stored in the ROM 14.

In Tables 1 and 2, an address H is an address of the more significant 2 bits of the ROM 14, and an address L is an address of the less significant 8 bits of the ROM 14. Also, b[31, ..., 24] is coefficient data of the more significant 8 bits, b[23, ..., 16] is coefficient data of the next more significant 8 bits, b[15, ..., 8] is coefficient data of the further next more significant 8 bits and b[7, ..., 0] is coefficient data of the less significant 8 bits.

Table 3 is a transformation table for transforming the elements on the Galois field $GF(2^8)$ from vector representation into those in power representation. Table 3 is presented for reference's sake, and is not any data which is used directly in the present preferred embodiment. As apparent from Table 3, it can be seen that, when data values of the address L of the ROM 14 as shown in Tables 1 and 2 are transformed into those in the power representation, those correspond to the term $\alpha^n$ (where n is an integer equal to or larger than zero) in the values written in the address. Accordingly, it can be understood that, for example, if 0 is inputted as the address H and the element of the Galois field $GF(2^8)$ in vector representation (8 bits) is inputted to the address L in the ROM 14, then the ROM 14 outputs the product on the Galois field of the coefficients $k_{12}$, $k_{11}$, $k_{10}$ and $k_9$ of the generator polynomial and the value inputted to the address L.

TABLE 1

| Address H | Address L | b[31, ..., 24] | b[23, ..., 16] | b[15, ..., 8] | b[7, ..., 0] |
|---|---|---|---|---|---|
| 0 | 00H | 0 | 0 | 0 | 0 |
| 0 | 01H | $k_{12}$ | $k_{11}$ | $k_{10}$ | $k_9$ |
| 0 | 02H | $k_{12} \cdot \alpha$ | $k_{11} \cdot \alpha$ | $k_{10} \cdot \alpha$ | $k_9 \cdot \alpha$ |
| 0 | 03H | $k_{12} \cdot \alpha^{25}$ | $k_{11} \cdot \alpha^{25}$ | $k_{10} \cdot \alpha^{25}$ | $k_9 \cdot \alpha^{25}$ |
| 0 | 04H | $k_{12} \cdot \alpha^2$ | $k_{11} \cdot \alpha^2$ | $k_{10} \cdot \alpha^2$ | $k_9 \cdot \alpha^2$ |
| 0 | 05H | $k_{12} \cdot \alpha^{50}$ | $k_{11} \cdot \alpha^{50}$ | $k_{10} \cdot \alpha^{50}$ | $k_9 \cdot \alpha^{50}$ |
| ... | ... | ... | ... | ... | ... |
| 0 | FBH | $k_{12} \cdot \alpha^{234}$ | $k_{11} \cdot \alpha^{234}$ | $k_{10} \cdot \alpha^{234}$ | $k_9 \cdot \alpha^{234}$ |
| 0 | FCH | $k_{12} \cdot \alpha^{168}$ | $k_{11} \cdot \alpha^{168}$ | $k_{10} \cdot \alpha^{168}$ | $k_9 \cdot \alpha^{168}$ |
| 0 | FDH | $k_{12} \cdot \alpha^{80}$ | $k_{11} \cdot \alpha^{80}$ | $k_{10} \cdot \alpha^{80}$ | $k_9 \cdot \alpha^{80}$ |
| 0 | FEH | $k_{12} \cdot \alpha^{88}$ | $k_{11} \cdot \alpha^{88}$ | $k_{10} \cdot \alpha^{88}$ | $k_9 \cdot \alpha^{88}$ |
| 0 | FFH | $k_{12} \cdot \alpha^{175}$ | $k_{11} \cdot \alpha^{175}$ | $k_{10} \cdot \alpha^{175}$ | $k_9 \cdot \alpha^{175}$ |
| 1 | 00H | 0 | 0 | 0 | 0 |
| 1 | 01H | $k_8$ | $k_7$ | $k_6$ | $k_5$ |
| 1 | 02H | $k_8 \cdot \alpha$ | $k_7 \cdot \alpha$ | $k_6 \cdot \alpha$ | $k_5 \cdot \alpha$ |
| 1 | 03H | $k_8 \cdot \alpha^{25}$ | $k_7 \cdot \alpha^{25}$ | $k_6 \cdot \alpha^{25}$ | $k_5 \cdot \alpha^{25}$ |
| 1 | 04H | $k_8 \cdot \alpha^2$ | $k_7 \cdot \alpha^2$ | $k_6 \cdot \alpha^2$ | $k_5 \cdot \alpha^2$ |
| 1 | 05H | $k_8 \cdot \alpha^{50}$ | $k_7 \cdot \alpha^{50}$ | $k_6 \cdot \alpha^{50}$ | $k_5 \cdot \alpha^{50}$ |
| ... | ... | ... | ... | ... | ... |
| 1 | FBH | $k_8 \cdot \alpha^{234}$ | $k_7 \cdot \alpha^{234}$ | $k_6 \cdot \alpha^{234}$ | $k_5 \cdot \alpha^{234}$ |
| 1 | FCH | $k_8 \cdot \alpha^{168}$ | $k_7 \cdot \alpha^{168}$ | $k_6 \cdot \alpha^{168}$ | $k_5 \cdot \alpha^{168}$ |
| 1 | FDH | $k_8 \cdot \alpha^{80}$ | $k_7 \cdot \alpha^{80}$ | $k_6 \cdot \alpha^{80}$ | $k_5 \cdot \alpha^{80}$ |
| 1 | FEH | $k_8 \cdot \alpha^{88}$ | $k_7 \cdot \alpha^{88}$ | $k_6 \cdot \alpha^{88}$ | $k_5 \cdot \alpha^{88}$ |
| 1 | FFH | $k_8 \cdot \alpha^{175}$ | $k_7 \cdot \alpha^{175}$ | $k_6 \cdot \alpha^{175}$ | $k_5 \cdot \alpha^{175}$ |

TABLE 2

| Address H | Address L | b[31, ..., 24] | b[23, ..., 16] | b[15, ..., 8] | b[7, ..., 0] |
|---|---|---|---|---|---|
| 2 | 00H | 0 | 0 | 0 | 0 |
| 2 | 01H | $k_4$ | $k_3$ | $k_2$ | $k_1$ |
| 2 | 02H | $k_4 \cdot \alpha$ | $k_3 \cdot \alpha$ | $k_2 \cdot \alpha$ | $k_1 \cdot \alpha$ |
| 2 | 03H | $k_4 \cdot \alpha^{25}$ | $k_3 \cdot \alpha^{25}$ | $k_2 \cdot \alpha^{25}$ | $k_1 \cdot \alpha^{25}$ |
| 2 | 04H | $k_4 \cdot \alpha^2$ | $k_3 \cdot \alpha^2$ | $k_2 \cdot \alpha^2$ | $k_1 \cdot \alpha^2$ |
| 2 | 05H | $k_4 \cdot \alpha^{50}$ | $k_3 \cdot \alpha^{50}$ | $k_2 \cdot \alpha^{50}$ | $k_1 \cdot \alpha^{50}$ |
| ... | ... | ... | ... | ... | ... |
| 2 | FBH | $k_4 \cdot \alpha^{234}$ | $k_3 \cdot \alpha^{234}$ | $k_2 \cdot \alpha^{234}$ | $k_1 \cdot \alpha^{234}$ |
| 2 | FCH | $k_4 \cdot \alpha^{168}$ | $k_3 \cdot \alpha^{168}$ | $k_2 \cdot \alpha^{168}$ | $k_1 \cdot \alpha^{168}$ |
| 2 | FDH | $k_4 \cdot \alpha^{80}$ | $k_3 \cdot \alpha^{80}$ | $k_2 \cdot \alpha^{80}$ | $k_1 \cdot \alpha^{80}$ |
| 2 | FEH | $k_4 \cdot \alpha^{88}$ | $k_3 \cdot \alpha^{88}$ | $k_2 \cdot \alpha^{88}$ | $k_1 \cdot \alpha^{88}$ |
| 2 | FFH | $k_4 \cdot \alpha^{175}$ | $k_3 \cdot \alpha^{175}$ | $k_2 \cdot \alpha^{175}$ | $k_1 \cdot \alpha^{175}$ |
| 3 | 00H | 0 | 0 | 0 | 0 |
| 3 | 01H | 0 | 0 | 0 | 0 |
| 3 | 02H | 0 | 0 | 0 | 0 |

TABLE 2-continued

| Address H | Address L | b[31, ..., 24] | b[23, ..., 16] | b[15, ..., 8] | b[7, ..., 0] |
|---|---|---|---|---|---|
| 3 | 03H | 0 | 0 | 0 | 0 |
| 3 | 04H | 0 | 0 | 0 | 0 |
| 3 | 05H | 0 | 0 | 0 | 0 |
| ... | ... | ... | ... | ... | ... |
| 3 | FBH | 0 | 0 | 0 | 0 |
| 3 | FCH | 0 | 0 | 0 | 0 |
| 3 | FDH | 0 | 0 | 0 | 0 |
| 3 | FEH | 0 | 0 | 0 | 0 |
| 3 | FFH | 0 | 0 | 0 | 0 |

TABLE 3

| Vector representation | Power representation |
|---|---|
| 00000000 | x |
| 00000001 | $\alpha^0$ |
| 00000010 | $\alpha^1$ |
| 00000011 | $\alpha^{25}$ |
| 00000100 | $\alpha^2$ |
| 00000101 | $\alpha^{50}$ |
| 00000110 | $\alpha^{26}$ |
| 00000111 | $\alpha^{198}$ |
| ... | ... |
| 11111010 | $\alpha^{244}$ |
| 11111011 | $\alpha^{234}$ |
| 11111100 | $\alpha^{168}$ |
| 11111101 | $\alpha^{80}$ |
| 11111110 | $\alpha^{88}$ |
| 11111111 | $\alpha^{175}$ |

Hereinbelow, the error correction encoding process in the device for error correcting coding of FIG. 1 will be described with reference to FIG. 2.

First of all, at the leading edge of an output pulse signal of the decoder 26 that synchronizes with the trailing edge of the first clock CLK, the 32-bit bus and 23 select the 32-bit latch 22. At this time, since the input data of the 8-bit EOR computing unit 18 are the data of 00H, which is the less significant 8 bits of the output data from the ROM 14, and the data of 00H corresponding to the 16th to 9th bits of the output data from the 32-bit latch 22, the output data from the 8-bit EOR computing unit 18 is 00H. Therefore, input data to the 8-bit EOR computing unit 11 are the data of 00H, which is the output data from the 8-bit EOR computing unit 11, and inputted data $i_{000}$, so that the data $i_{000}$ is stored in the 8-bit latch 12. Thus, the data $d_{000}$ of FIG. 2 can be expressed by the Equation (15). At the same time, the 8-bit EOR computing unit 15 outputs an EOR data between output data from the 8-bit latch 27 and the more significant 8 bits of output data from the ROM 14, while the 8-bit EOR computing units 16, 17 and 18 output 24-bit data of EORs between the more significant 24 bits of output data from the 32-bit latch 22 and the less significant 24 bits of output data from the ROM 14. Accordingly, the output data from these four 8-bit EOR computing units 15, 16, 17 and 18 are written into the 32-bit latch 22. Also, simultaneously with this time, the less significant 8 bits of the data that have previously been written in the 32-bit latch 22 is written into the 8-bit latch 27. In this case, since the 8-bit input data to the 8-bit EOR computing units 15, 16, 17 and 18 are all 00H, the data written into the 32-bit latch 22 is 00000000H. The data written into the 8-bit latch 27 is 00H. After these operations, the less significant 8 bits of the address given to the ROM 14 become $d_{000}$, and its more significant 2 bits become "3". At this time, such data as shown in Table 1 has been stored in the ROM 14, so that the computation of products on the Galois field can be obtained with reference to the table. In this case, since the more significant 2 bits of the address is "3", the ROM 14 outputs the data of 00000000H from its data terminal. Therefore, the output data $A_0$ from the ROM 14 of FIG. 2, if grouped in a unit of 8 bits, can be represented by the following equation:

$$A_0=(00H, 00H, 00H, 00H) \tag{17}$$

Next, at the leading edge of the output pulse signal of the decoder 28 that synchronizes with the trailing edge of the second clock CLK, the 8-bit latch 27 is cleared to 0. The less significant 8 bits of the address given to the ROM 14 remains unchanged as $d_{000}$, while its more significant 2 bits become "0". Therefore, from Table 1, the output data $A_1$ from the ROM 14 of FIG. 2 can be expressed by the following equation:

$$A_1=(k_{12} \cdot d_{000}, k_{11} \cdot d_{000}, k_{10} \cdot d_{000}, k_9 \cdot d_{000}) \tag{18}$$

where the product sign, "•", device the computation of a product on the Galois field.

Next, at the leading edge of an output signal from the decoder 24 that synchronizes with the trailing edge of the third clock CLK, the 32-bit bus selectors 19 and 23 select the 32-bit latch 20. At this time, the 8-bit EOR computing unit 15 outputs an EOR data between output data from the 8-bit latch 27 and the more significant 8 bits of output data from the ROM 14, while the 8-bit EOR computing units 16, 17 and 18 output 24-bit data of EORs between the more significant 24 bits of output data from the 32-bit latch 20 and the less significant 24 bits of output data from the ROM 14. Accordingly, 32-bit output data from these 8-bit EOR computing units 15, 16, 17 and 18 are written into the 32-bit latch 20. Also, simultaneously with this time, the less significant 8 bits of the data that have previously been written in the 32-bit latch 20 is written into the 8-bit latch 27. In this case, since the output data from the 8-bit latch 27 is 00H and the more significant 24 bits of output data from the 32-bit latch 20 is also data of 000000H, the data written into the 32-bit latch 20 is the data $A_1$ itself expressed by the Equation (18). Therefore, ($p_{000}$, $p_{001}$, $p_{002}$, $p_{003}$), which is the output data from the 32-bit latch 20 of FIG. 2, can be expressed by the following equation:

$$(p_{000}, p_{001}, p_{002}, p_{003})=(k_{12} \cdot d_{000}, k_{11} \cdot d_{000}, k_{10} \cdot d_{000}, k_9, \cdot d_{000}) \tag{19}$$

Also, the data written into the 8-bit latch 27 is data of 00H. After these operations, the less significant 8 bits of the address given to the ROM 14 become $d_{000}$, and its more significant 2 bits become "1". Therefore, the output data $A_2$ from the ROM 14 of FIG. 2 can be represented by the following equation:

$$A_2=(k_8 \cdot d_{000}, k_7 \cdot d_{000}, k_6 \cdot d_{000}, k_5 \cdot d_{000}) \tag{20}$$

Likewise, data ($p_{004}$, $p_{005}$, $p_{006}$, $p_{007}$) can be expressed by the following equation:

$$(p_{004}, p_{005}, p_{006}, p_{007}) = (k_8 \cdot d_{000}, k_7 \cdot d_{000}, k_6 \cdot d_{000}, k_5 \cdot d_{000}) \quad (21)$$

Also, the output data $A_3$ from the ROM 14 can be expressed by the following equation:

$$A_3 = (k_4 \cdot d_{000}, k_3 \cdot d_{000}, k_2 \cdot d_{000}, k_1 \cdot d_{000}) \quad (22)$$

Also, data ($p_{008}$, $p_{009}$, $p_{010}$, $p_{011}$) can be expressed by the following equation:

$$(p_{008}, p_{009}, p_{010}, p_{011}) = (k_4 \cdot d_{000}, k_3 \cdot d_{000}, k_2 \cdot d_{000}, k_1 \cdot d_{000}) \quad (23)$$

However, the output data from the 8-bit latch 12 will change in synchronization with the trailing edge of the fifth clock CLK. More specifically, since the 32-bit bus selectors 19 and 23 select the 32-bit latch 22 at the leading edge of the output pulse signal of the decoder 26, input data to the 8-bit EOR computing unit 11 become $p_{011}$, which is output data from the 8-bit EOR computing unit 18, and input data $i_{001}$, in a manner similar to that of the case of the first clock CLK, so that data $d_{001}$ expressed by the Equation (15) is stored in the 8-bit latch 12. In addition, the sign of addition in the Equation (15) device a computation of an addition on the Galois field.

Next described is the state at the leading edge of the output signal from the decoder 24 that synchronizes with the trailing edge of the seventh clock CLK. At this time, the 32-bit bus selectors 19 and 23 select the 32-bit latch 20. Reasoning in a manner similar to that of the above-mentioned process, the output data from the 8-bit latch 27 is 00H and the more significant 24 bits of output data from the 32-bit latch 20 are as follows:

$$(p_{000}, p_{001}, p_{002}) = (k_{12} \cdot d_{000}, k_{11} \cdot d_{000}, k_{10} \cdot d_{000}) \quad (24)$$

so that the data represented by $$(p_{012}, p_{013}, p_{014}, p_{015}) \quad (25)$$
$$= (k_{12} \cdot d_{001}, k_{11} \cdot d_{001} + p_{000},$$
$$k_{10} \cdot d_{001} + p_{001}, k_9 \cdot d_{001} + p_{002})$$
$$= (k_{12} \cdot d_{001}, k_{11} \cdot d_{001} + k_{12} \cdot d_{000}, k_{10} \cdot d_{001} +$$
$$k_{11} \cdot d_{000}, k_9 \cdot d_{001} + k_{10} \cdot d_{000})$$

is written into the 32-bit latch 20.

Also, data $p_{003}$, which is the less significant 8 bits of the data value prior to the writing into the 32-bit latch 20 is written into the 8-bit latch 27 at the same time. After these operations, the less significant 8 bits of the address given to the ROM 14 become data $d_{001}$, and its more significant 2 bits become "1".

Therefore, the output data $B_2$ from the ROM 14 of FIG. 2 can be expressed by the following equation:

$$B_2 = (k_8 \cdot d_{001}, k_7 \cdot d_{001}, k_6 \cdot d_{001}, k_5 \cdot d_{001}) \quad (26)$$

Likewise, data ($p_{016}$, $p_{017}$, $p_{018}$, $P_{019}$) can be expressed by the following equation:

$$(p_{016}, p_{017}, p_{018}, p_{019}) \quad (27)$$
$$= (k_8 \cdot d_{001} + p_{003}, k_7 \cdot d_{001} + p_{004},$$
$$k_6 \cdot d_{001} + p_{005}, k_5 \cdot d_{001} + p_{006})$$
$$= (k_8 \cdot d_{001} + k_9 \cdot d_{000}, k_7 \cdot d_{001} + k_8 \cdot d_{000}, k_6 \cdot d_{001} +$$
$$k_7 \cdot d_{000}, k_5 \cdot d_{001} + k_6 \cdot d_{000})$$

Also, the output data $B_3$ from the ROM 14 can be expressed by the following equation:

$$B_3 = (k_4 \cdot d_{001}, k_3 \cdot d_{001}, k_2 \cdot d_{001}, k_1 \cdot d_{001}) \quad (28)$$

Further, data ($p_{020}$, $p_{021}$, $p_{022}$, $p_{023}$) can be expressed by the following equation:

$$(p_{020}, p_{021}, p_{022}, p_{023}) \quad (29)$$
$$= (k_4 \cdot d_{001} + p_{007}, k_3 \cdot d_{001} + p_{008},$$
$$k_2 \cdot d_{001} + p_{009}, k_1 \cdot d_{001} + p_{010})$$
$$= (k_4 \cdot d_{001} + k_5 \cdot d_{000}, k_3 \cdot d_{001} + k_4 \cdot d_{000}, k_2 \cdot d_{001} +$$
$$k_3 \cdot d_{000}, k_1 \cdot d_{001} + k_2 \cdot d_{000})$$

Also, since the output data from the 8-bit EOR computing unit 18 is $p_{023}$ at the leading edge of the output signal from the decoder 26 that synchronizes with the trailing edge of the ninth clock CLK, data $d_{002}$ can be expressed by the following equation:

$$d_{002} = i_{002} + p_{023} = i_{002} + k_1 \cdot d_{001} \quad (30)$$

Repeating the above-mentioned operations until the (4×20+1)-th clock CLK is inputted completes a parity word of total 12 symbols in the 32-bit latches 20 and 21 and 22. Adding the parity word of 12 symbols here generated to the information symbols of 20-symbol input data, i.e., information word, that have been inputted so far completes a code word of total 32 symbols, i.e., output symbol string. Therefore, in succession to the information word of 20 symbols, a parity word of 12 symbols are outputted, as output data of an error correction coded code word (=information word+parity word), sequentially in parallel in a unit of 8 bits, by the delay circuit 300 and the output data selector 310.

As described above, in the present preferred embodiment, a Reed-Solomon code RS (n, n–12, d=13) having a minimum inter-code distance d=13 can be coded by the following:

(a) the 32-bit ROM 14, which is a device for storing product data, after computing a plurality of product data on the Galois field between individual coefficients of a generator polynomial and input information symbols in response to 8-bit input data which is an information word, the ROM 14 being for storing four pieces of product data as one set with respect to each address, wherein four product data as one set can be read out therefrom by the EOR computing units 15 to 18 in parallel (simultaneously);

(b) the three 32-bit latches 20, 21 and 22, which are first storage devices;

(c) the 8-bit latch 27, which is second storage devices;

(d) the 8-bit EOR computing units 15, 16 and 17 and 18, which are the EOR computing devices;

(e) the 32-bit bus selectors 19 and 20, which are first selecting devices;

(f) the quaternary counter 13, the latches 12 and 29 and the decoders 24 to 26 and 28, which are the read control device; and (g) the delay circuit 300 and the output data selector 310, which are the second selecting device.

In the above-mentioned first preferred embodiment, the ROM 14 that has stored a plurality of product data is configured so as to be readable for the EOR computing units 15 to 18 in such a manner that four pieces of product data can be read out as one set in parallel (simultaneously), and the operations for encoding process are achieved by simultaneously processing four pieces of product data by using the three 32-bit latches 20 to 22 selectively and repeatedly in succession. Thus, the circuit configuration can be greatly simplified, as compared with the circuit configuration of the prior art device for error correcting coding of FIG. 14. Besides, the computations can be executed with a high efficiency and with a high speed, so that error correcting codes can be encoded at such a coding rate that the device can be put into practical use enough.

In the first preferred embodiment, if the number of 32-bit latches 20, 21 and 22 constituting the first storage is increased so as to be the number equal to or greater than three and if the contents stored in the ROM 14 are changed so as to correspond thereto, then it becomes possible to encode any error correcting code having an even longer minimum inter-code distance d by using a similar circuit without changing the circuit configuration.

SECOND PREFERRED EMBODIMENT

Figure 3:
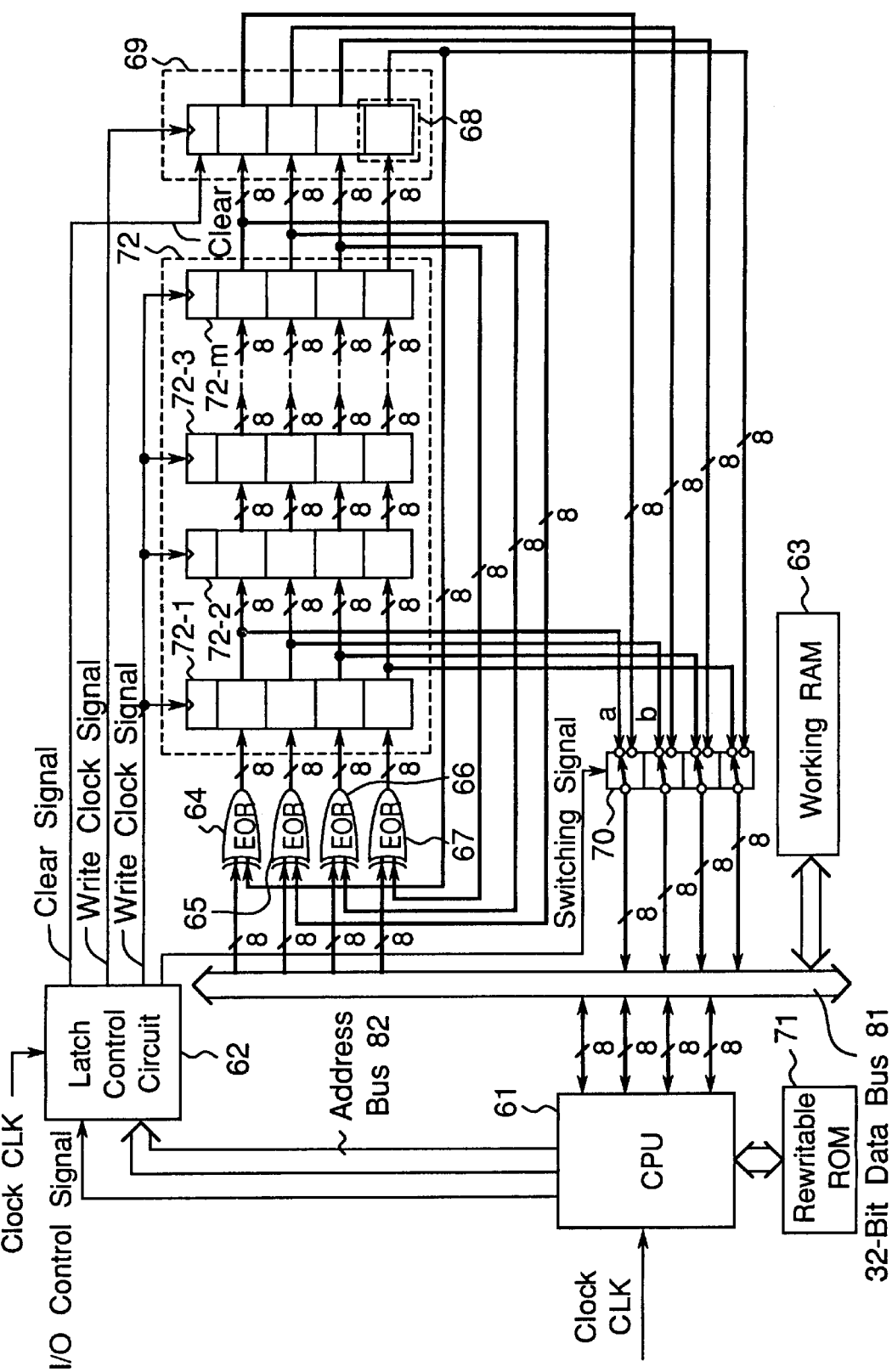
FIG. 3 is a block diagram of a device for error correcting coding according to a second preferred embodiment of the present invention.

FIG. 3 is a block diagram of a device for error correcting coding according to a second preferred embodiment of the present invention. Referring to FIG. 3, the device for error correcting coding of this second preferred embodiment comprises:

(a) a CPU (Central Processing Unit) 61 which has a 32-bit data bus 81 and controls the operation of the device;

(b) a latch control unit 62 for generating control signals for a plurality of m latches 72-1, 72-2, . . . and 72-m in a queue memory 72 in response to both address data outputted from the CPU 61 via an address bus 82 and a memory control signal;

(c) a working RAM 63 which is used as a work area for the CPU 61;

(d) 8-bit EOR computing units 64, 65, 66 and 67;

(e) a 32-bit bus selector 70;

(f) a ROM 71 which is a rewritable ROM (Read-only Memory) implemented by, for example, EPROM or EEPROM, and which previously stores programs for encoding process to be executed by the CPU 61 as well as data needed to execute the programs;

(g) a queue memory 72 which is first storage device, and which has a plurality of m 32-bit latches 72-1 to 72-m to constitute a shift register that is a FIFO (First-In First-Out) memory;

(h) a 32-bit latch 69 for temporarily latching and reading out the contents of the queue memory 72 under the control of the CPU 61; and (i) a 8-bit latch 68 which is second storage device, and which is a part of the 32-bit latch 69, for latching data of the less significant 8 bits in the 32-bit latch 69.

Figure 4:
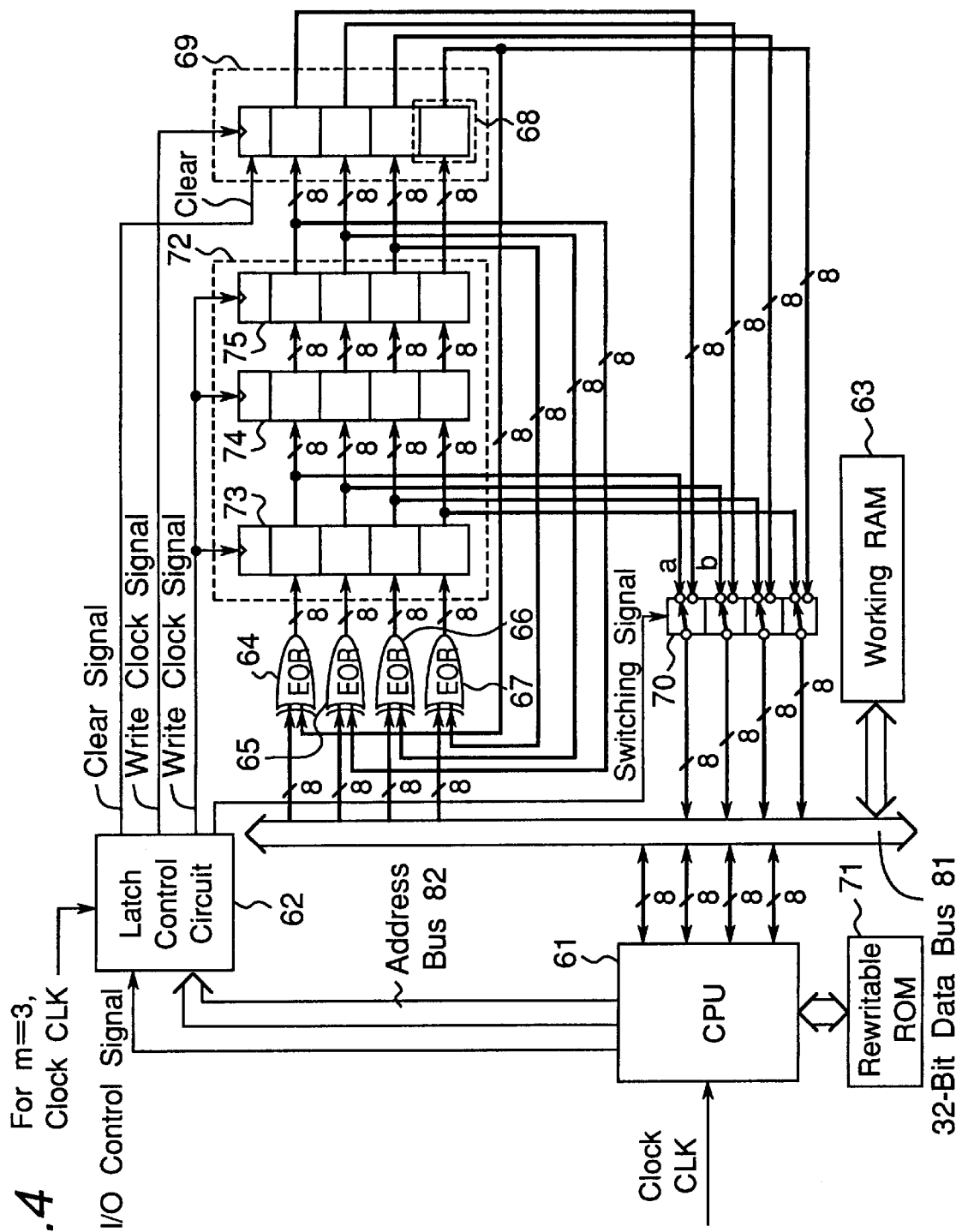
FIG. 4 is a block diagram where m=3 in the device for error correcting coding of FIG. 3.

The second preferred embodiment employs a m-stage 32-bit queue memory 72 equipped with a plurality of m 32-bit latches 72-1 to 72-m, in place of the bus selectors 19 and 23 of the first preferred embodiment. For simplified description of the operation example of the second preferred embodiment, the number of m latch stages constituting the queue memory 72 is 3, and the queue memory 72 comprises three 32-bit latches 73, 74 and 75. A block diagram for m=3 in FIG. 3 is shown in FIG. 4. Therefore, the operation example will be described with reference to FIG. 4.

Referring to FIG. 4, the CPU 61 is connected to the 32-bit data bus 81, while the working RAM 63 is also connected to the 32-bit data bus 81. Data of an information word, which is inputted and taken as the target of processing, is written into an information word area of a code word buffer BufB [ ] within the working RAM 63 via the 32-bit data bus 81, is read out from the area via the 32-bit data bus 81 and is inputted to the first input terminal of the 8-bit EOR computing units 64, 65, 66 and 67. After encoding processes, as described below in detail, are executed, the parity word is read out from the code word buffer BufB [ ] within the working RAM 63, and is outputted as an encoded code word in succession to the data of the information word.

In FIG. 4, the data outputted from the 8-bit EOR computing units 64, 65, 66 and 67 are inputted to the b contact of the 32-bit bus selector 70 via the three 32-bit latches 73, 74 and 75, and the 32-bit latch 69 connected in series within the 32-bit queue memory 72. Also, the output data from the 8-bit latch 68 is inputted to the second input terminal of the EOR computing unit 65. Also, 32-bit output data outputted from the 32-bit latch 73 is inputted to the a-contact of the 32-bit bus selector 70. The 32-bit bus selector 70, in response to a control signal outputted from the latch control unit 62, selectively outputs one 32-bit data out of the 32-bit data inputted to the a-contact and the 32-bit data inputted to the b-contact, to the CPU 61 and the working RAM 63 via the 32-bit data bus 81.

In FIG. 4, the three 32-bit latches 73, 74 and 75 connected in series constitute the queue memory 72, where a selection is made so that the 32-bit latch 73 operates as a writing latch while the latch 75 operates as a reading latch. This selection is indeed fixed physically, but is not fixed logically because the data stored in the individual 32-bit latches will be moved to the succeeding-stage 32-bit latches by a write operation of data into the queue memory 72 and a read operation of data from the queue memory 72, with the result that the data in the individual 32-bit latches are sequentially selected. In the present preferred embodiment, an input and output address (hereinafter, referred to as an I/O address) along with an input and output control signal (hereinafter, referred to as an I/O control signal) is transmitted from the CPU 61 to the latch control circuit 62 via the address bus 82, by which the latch control unit 62 performs control operation by transmitting control signal, as shown below, to the 32-bit latch 73, 74, 75 and 69 and bus selector 70:

(a) The CPU 61 outputs an "AdrsQueue" as an I/O address to the latch control circuit 62, and further outputs a "write signal" as an I/O control signal to the latch control circuit 62, via the address data bus 82. In response to this, the latch control circuit 62 generates a write clock signal synchronized with the clock CLK, outputting the same write clock signal to the 32-bit latches 73, 74, 75 and 69.

(b) The CPU 61 outputs an "AdrsQueue" as an I/O address to the latch control circuit 62 and further outputs a "read signal" as an I/O control signal to the latch control circuit 62, via the address data bus 82. In response to this, the latch control circuit 62 generates a write clock signal synchronized with the clock CLK, outputting it to the 32-bit latches 73, 74, 75 and 69.

(c) The CPU 61 outputs an "AdrsFeed" as an I/O address to the latch control circuit 62 and further outputs a "write signal" as an I/O control signal to the latch control circuit 62, via the address data bus 82. In response to this, the latch control circuit 62 generates a write clock signal synchronized with the clock CLK, outputting it to the 32-bit latches 73, 74 and 75.

(d) The CPU 61 outputs an "AdrsClearPort" as an I/O address to the latch control circuit 62 and further outputs a "write signal" as an I/O control signal to the latch control circuit 62, via the address data bus 82. In response to this, the latch control circuit 62 outputs a clear signal to the 32-bit latch 69, clearing the data stored in the 32-bit latch 69.

(e) The CPU 61 outputs an "AdrsQueue" as an I/O address to the latch control circuit 62 and further outputs an "access signal" as an I/O control signal to the latch control circuit 62, via the address data bus 82. In response to this, the latch control circuit 62 switches the bus selector 70 to the a-contact. As a result, data outputted from the 32-bit latch 73 is inputted to the CPU 61 and the working RAM 63 via the a-contact of the bus selector 70 and the 32-bit data bus 81.

(f) The CPU 61 outputs an "AdrsQueueLast" as an I/O address to the latch control circuit 62 and further outputs an "access signal" as an I/O control signal to the latch control circuit 62, via the address data bus 82. In response to this, the latch control circuit 62 switches the bus selector 70 to the b-contact.

As a result, data outputted from the 32-bit latch 69 is inputted to the CPU 61 and the working RAM 63 via the b-contact of the bus selector 70 and the 32-bit data bus 81.

Figure 5:
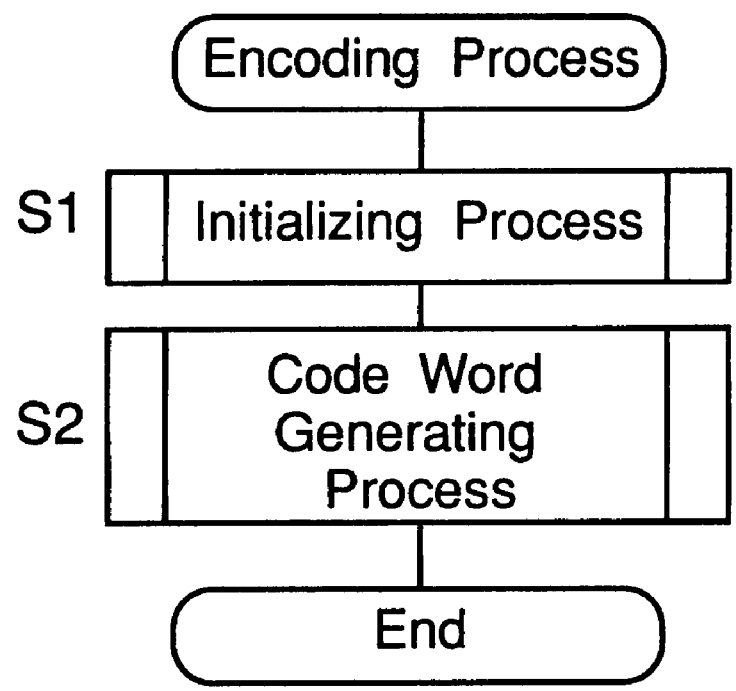
FIG. 5 is a flow chart showing an encoding process performed by a CPU 61 of the device for error correcting coding of FIG. 3.
Figure 6:
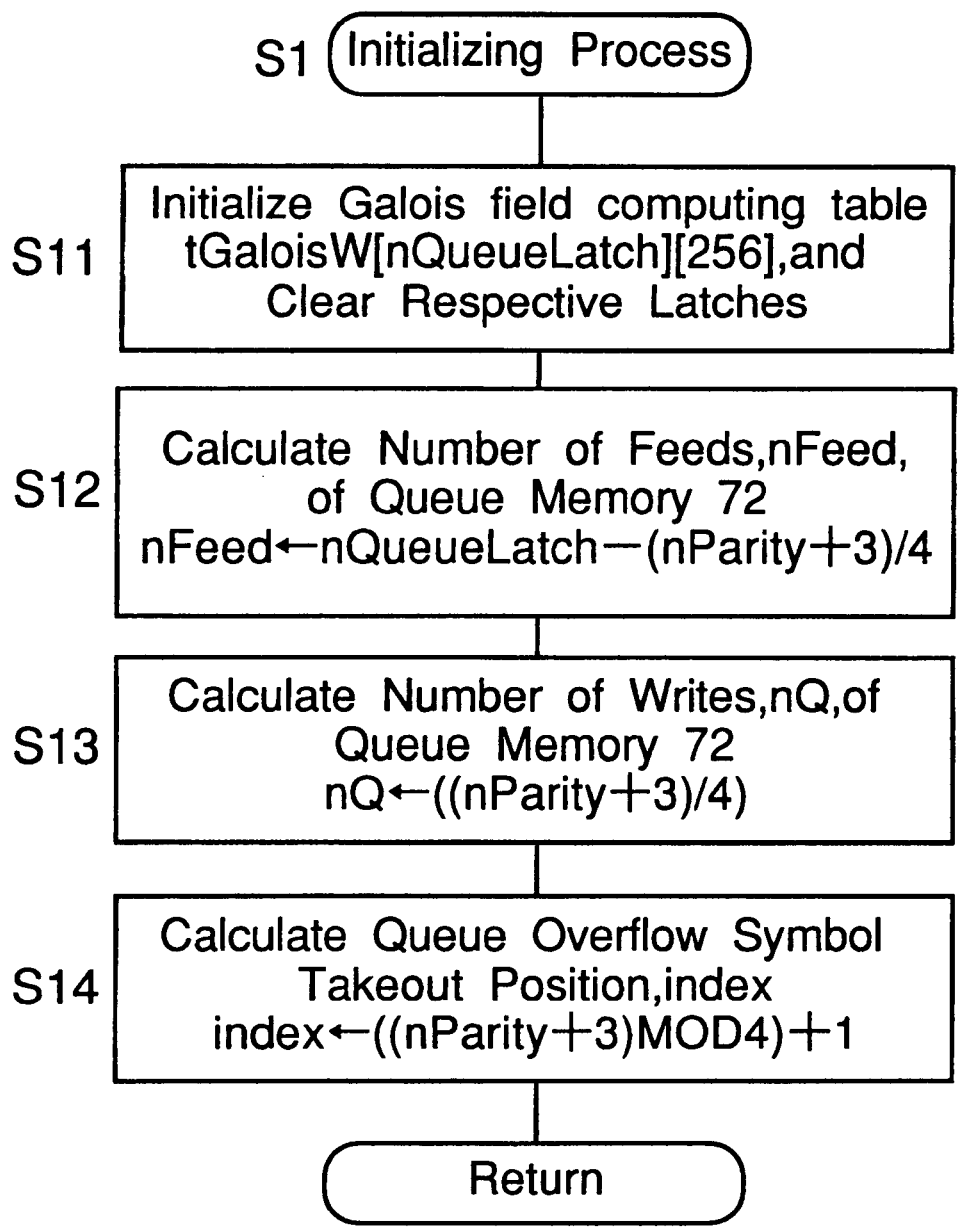
FIG. 6 is a flow chart showing an initializing process (step S1), which is a subroutine of FIG. 5.
Figure 7:
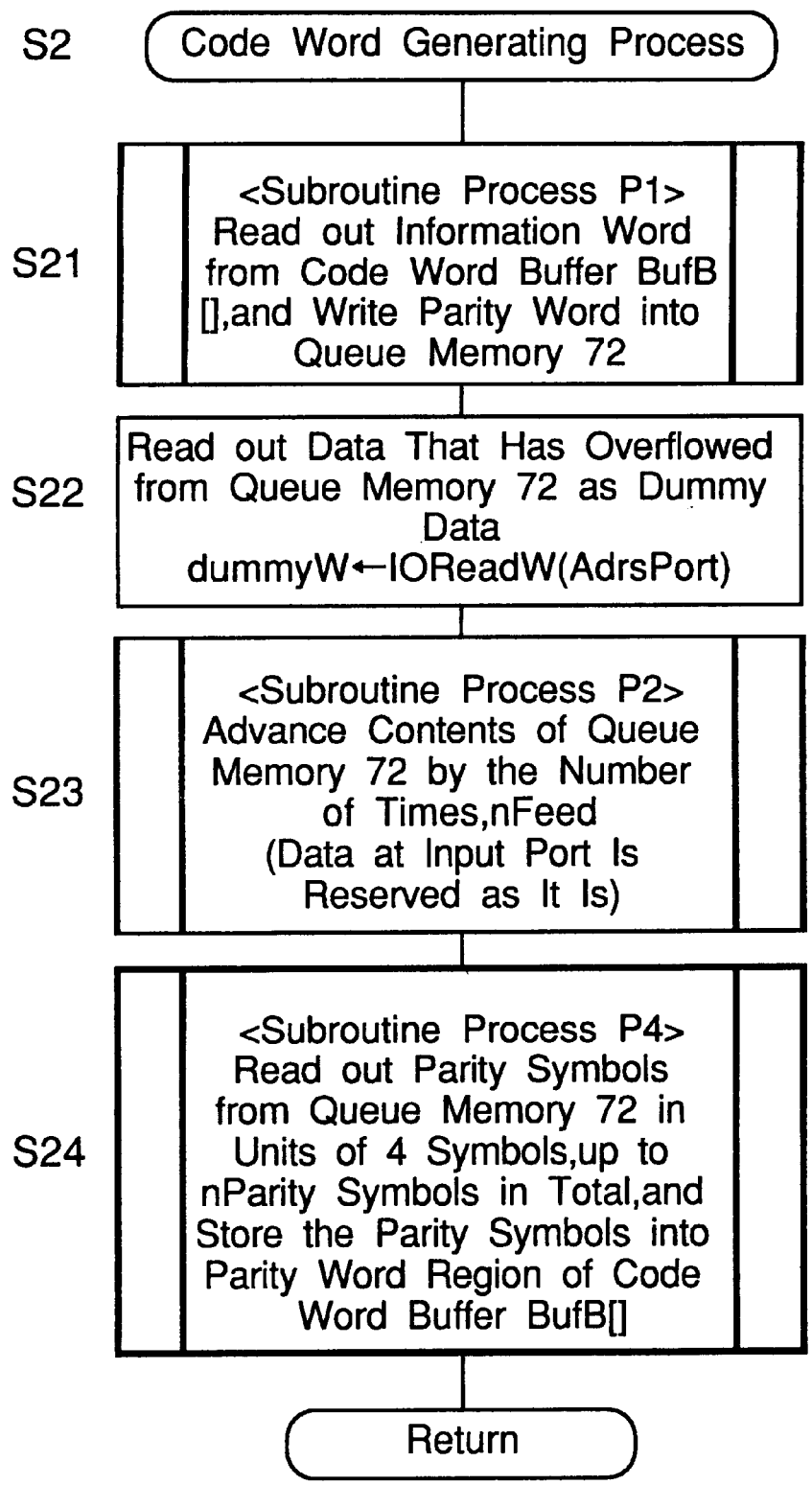
FIG. 7 is a flow chart showing a code word generating process (step S2), which is a subroutine of FIG. 5.
Figure 8:
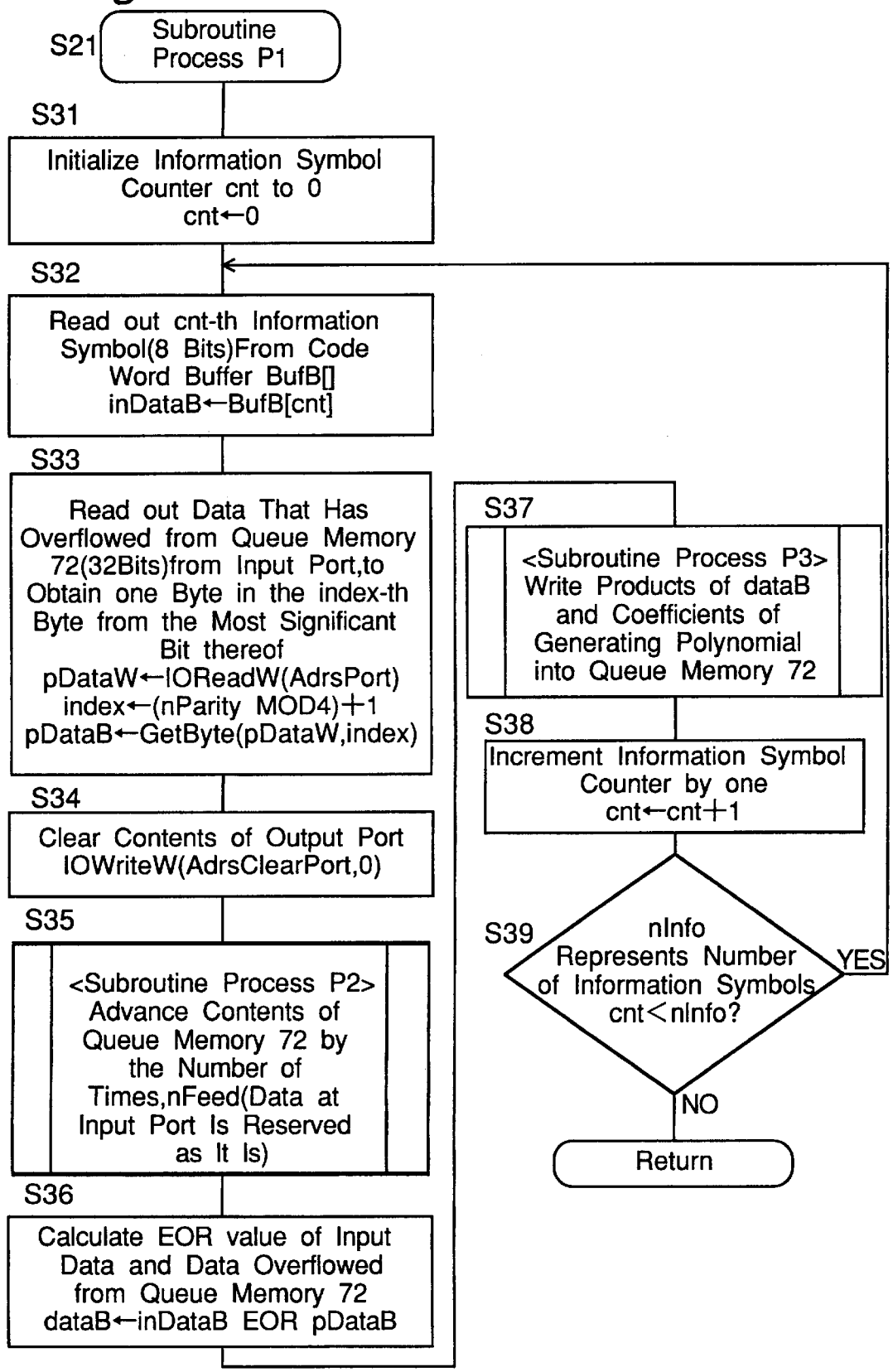
FIG. 8 is a flow chart showing a subroutine process P1 (step S7) of FIG. 7.
Figure 9:
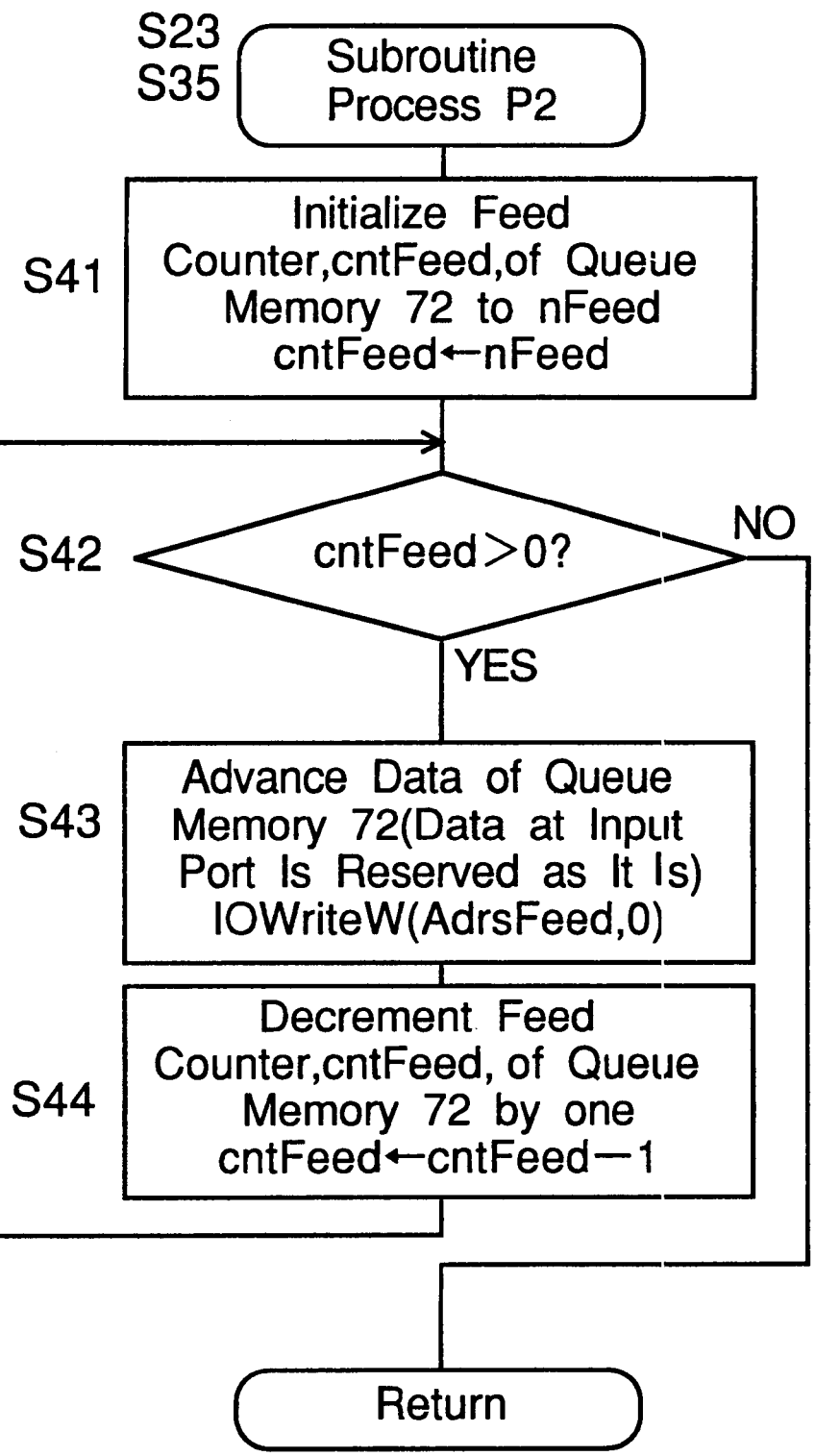
FIG. 9 is a flow chart showing a subroutine process P2 (steps S23 and S35) of FIGS. 7 and 8.
Figure 10:
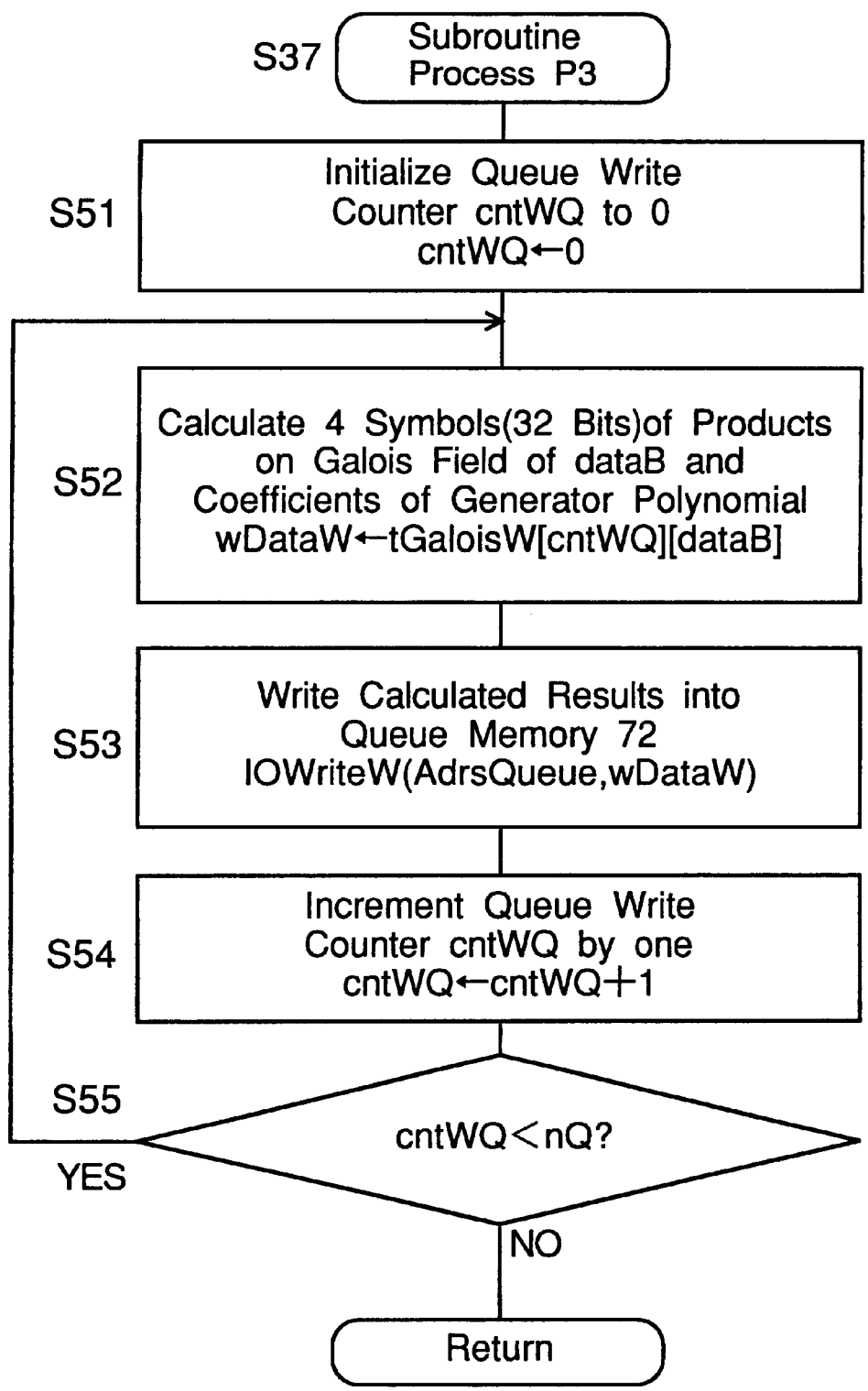
FIG. 10 is a flow chart showing a subroutine process P3 (step S37) of FIG. 8.
Figure 11:
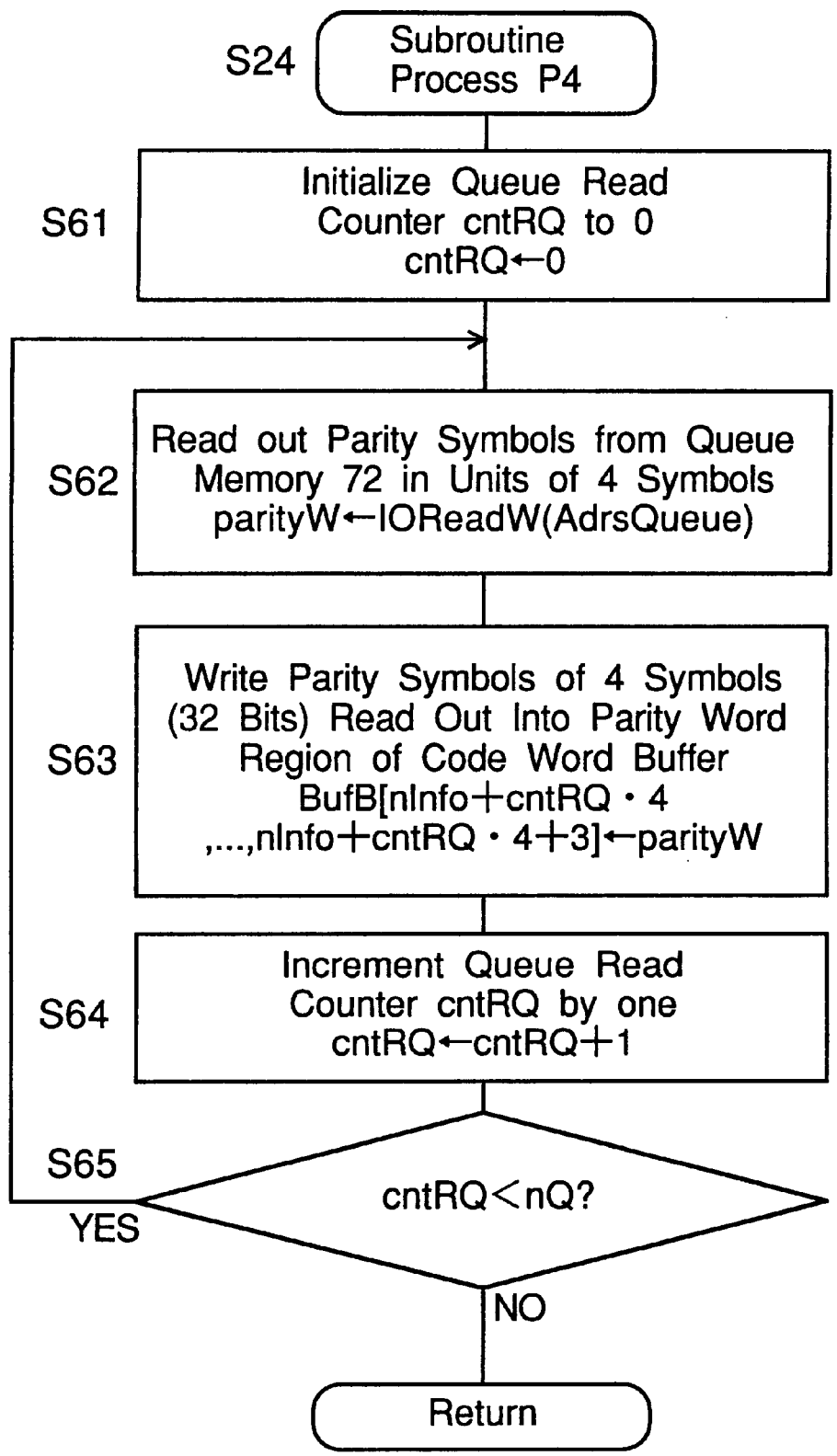
FIG. 11 is a flow chart showing a subroutine process P4 (step S24) of FIG. 7.
Figure 12:
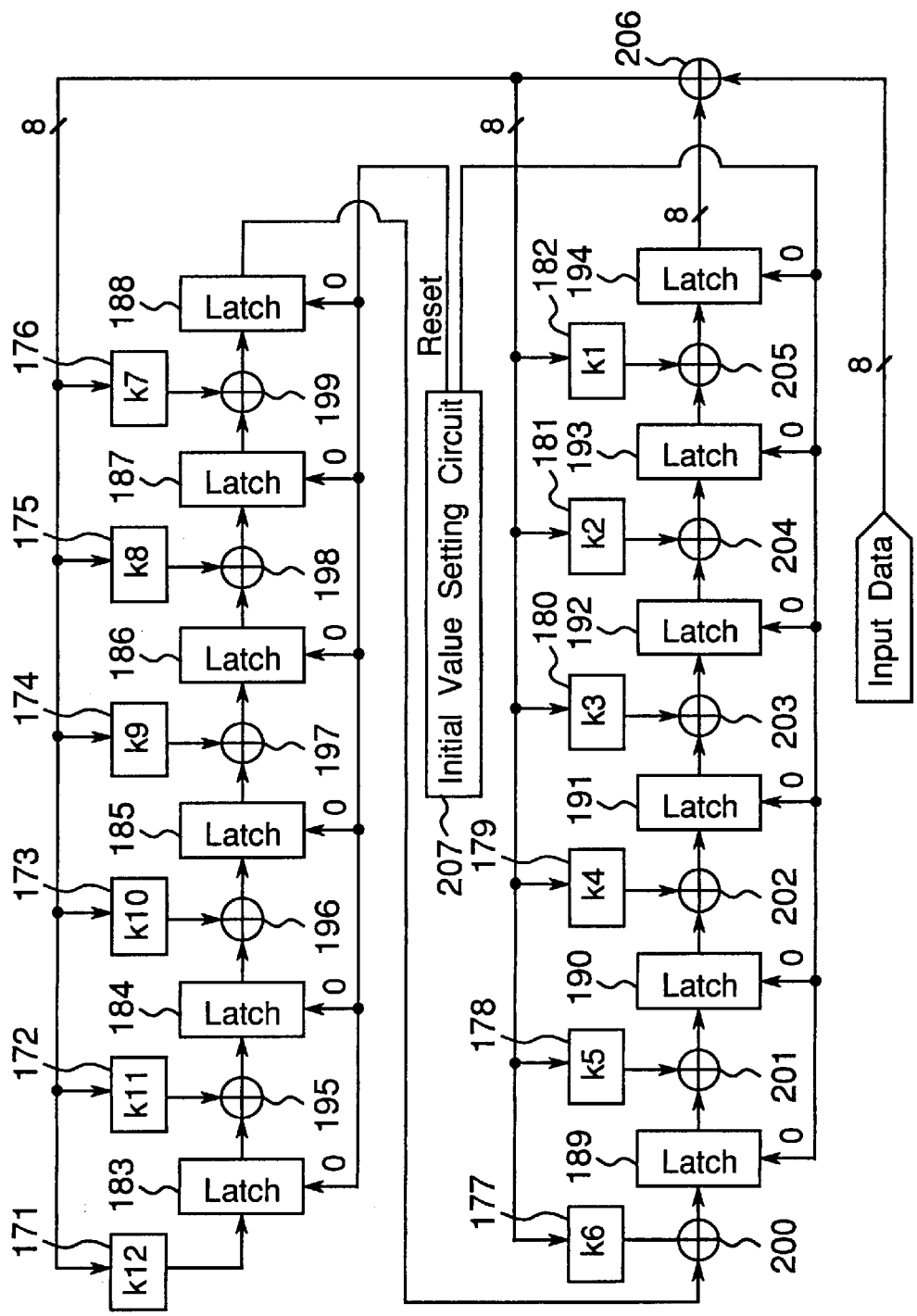
FIG. 12 is a block diagram of a device for error correcting coding according to the prior art.

FIG. 5 is a flow chart showing an encoding process performed by a CPU 61 of the device for error correcting coding of FIG. 3. FIG. 6 is a flow chart showing an initializing process (step S1), which is a subroutine of FIG. 5, and FIG. 7 is a flow chart showing a code word generating process (step S2), which is a subroutine of FIG. 5. FIG. 8 is a flow chart showing a subroutine process P1 (step S7) of FIG. 7, and FIG. 9 is a flow chart showing a subroutine process P2 (steps S23, S35) of FIGS. 7 and 8. FIG. 10 is a flow chart showing a subroutine process P3 (step S37) of FIG. 8, and FIG. 11 is a flow chart showing a subroutine process P4 (step S24) of FIG. 7. Programs for the control flows of encoding processes as shown in FIGS. 5 to 11 are previously stored in the ROM 1 connected to the CPU 61 in order to operate the device for error correcting coding shown in FIGS. 3 and 4, and is executed by the CPU 61.

As shown in FIG. 5, an initializing process as shown in FIG. 6 is first of all executed at step S1, and thereafter a code word generating process as shown in FIG. 7 is executed at step S2, where the encoding process is ended.

Next, various kinds of symbols used for the processing in FIGS. 6 to 11 will be described. The symbols, [ ] in a table name and [ ] in a buffer name, represent arrays, respectively, and if the name of the memory area is "name", elements of one dimensional array are represented as "name [m]", elements of two-dimensional array are represented as "name [m] [n]", where m and n are integers each equal to or larger than 0, respectively. Also, if "name [M] [N]" is written to express the size of an array, then effective elements are from "name [0] [0]" to "name [M−1] [N−1]".

"IOReadW (address)" is a function representing a data value obtained by reading out a 32-bit word from the I/O address represented by "address". Also, "IOWriteW (address, data)" represents a process of writing 32-bit word data represented by "data" into the I/O address represented by "address". "GetByte (data, index)" is a function representing the index-th byte data, as counted from the most significant bit (MSB) of the 32-bit word data represented by "data", where "index" is a natural number to be counted from 1.

The slash symbol "/" is a binary operator representing a division of integers, and "A MOD B" is a binary operator for computing a remainder resulting from dividing A by B. Also, "AND" is a binary operator for computing an AND for every bit, and "EOR" is a binary operator for computing an EOR for every bit.

Furthermore, if the array name is "name", then "name [x, ..., y]" represents the x-th to y-th elements of the array "name". "W" and "B", which are the last one character of a variable name or an array name, represent 32-bit data and 8-bit data, respectively.

Galois field operation table "tGaloisW [nQueueLatch] [256]", which is product data on the Galois field of input data and coefficients of the generator polynomial, is previously computed and stored in the ROM 71 and thereafter transferred from the ROM 71 to a region within the working RAM 63, and is written therein, in the initializing process of the CPU 61, or in the initializing process involved in changes of the minimum inter-code distance d of an error correcting code. In the case where a parity word of 12 symbols similar to that of the first preferred embodiment is added, the same data as the contents stored in the ROM 14 shown in Tables 1 and 2 is previously stored in the Galois field operation table "Tgaloisw [Nqueuelatch] [256]" (step S11). It is noted that "tgalois W [m] [n]" represents contents of data in which the address H of the ROM 14 is "m" and address L is "n" in the first preferred embodiment.

The code word buffer "BufB [ ]", which is a buffer memory set in a region within the working RAM 63, is divided into an information word region and a parity word region. In the information word region of the code word buffer "BufB [ ]", an information word to be coded, which has been inputted before executing the encoding process, is previously stored, starting with its leading head, while in the parity word region of the code word buffer "BufB [ ]", a parity word obtained when the encoding process is executed based on the inputted information word is stored. Thereafter, the information word and the parity word are outputted as a code word to external equipment.

The "AdrsQueueLast" of the I/O address is an address for reading out the contents of the 32-bit latch 73. Even if the CPU 61 has outputted to the latch control circuit 62 the "AdrsQueueLast" as an I/O address along with a "read signal" of the I/O control signal, there will be generated no write clock signal for the 32-bit latches 73, 74, 75 and 76 as described above, so that the contents of stored data in the queue memory 72 remain unchanged.

Figure 13:
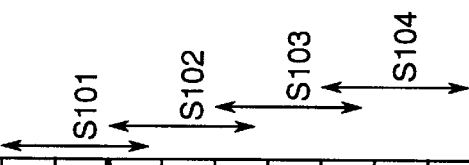
FIG. 13 is a chart for explaining the way of calculating a Reed-Solomon code RS (n, n–12, d=13) in the device for error correcting coding of FIG. 12.

Table 4 shows stored data of the 32-bit latches 73, 74, 75 and 69 of FIG. 4 in this operation example, in a case where the device for error correcting coding of this preferred embodiment operates according to the flow charts of FIGS. 5 to 11. In Table 4, double underlines represent data write, and underlines represent data read. Also, the notation of parity symbols having $p_{000}$ at their heads are the same as those in the first preferred embodiment and are values computed by the calculation method of the prior art as shown in FIG. 13.

TABLE 4

| Step | cnt | cntQ | Latch 73 | Latch 74 | Latch 75 | Latch 69 |
|------|-----|------|----------|----------|----------|----------|
| S1001 | — | — | 00000000 | 00000000 | 00000000 | 00000000 |
| S1002 | 0 | — | 00000000 | 00000000 | 00000000 | 00000000 |
| S1003 | 0 | — | 00000000 | 00000000 | 00000000 | 00000000 |
| S1004 | 0 | 3 | (p000, . . . , p003) | 00000000 | 00000000 | 00000000 |
| S1005 | 0 | 2 | (p004, . . . , p007) | (p000, . . . , p003) | 00000000 | 00000000 |
| S1006 | 0 | 1 | (p008, . . . , p011) | (p004, . . . , p007) | (p000, . . . , p003) | 00000000 |
| S1007 | 1 | 0 | (p008, . . . , p011) | (p004, . . . , p007) | (p000, . . . , p003) | 00000000 |
| S1008 | 1 | 0 | (p008, . . . , p011) | (p004, . . . , p007) | (p000, . . . , p003) | 00000000 |
| S1009 | 1 | 3 | (p012, . . . , p015) | (p008, . . . , p011) | (p004, . . . , p007) | (p000, . . . , p003) |
| S1010 | 1 | 2 | (p016, . . . , p019) | (p012, . . . , p015) | (p008, . . . , p011) | (p004, . . . , p007) |
| S1011 | 1 | 1 | (p020, . . . , p023) | (p016, . . . , p019) | (p012, . . . , p015) | (p008, . . . , p011) |
| S1012 | 2 | 0 | (p020, . . . , p023) | (p016, . . . , p019) | (p012, . . . , p015) | (p008, . . . , p011) |
| S1013 | 2 | 0 | (p020, . . . , p023) | (p016, . . . , p019) | (p012, . . . , p015) | 00000000 |
| S1014 | 2 | 3 | (p024, . . . , p027) | (p020, . . . , p023) | (p016, . . . , p019) | (p012, . . . , p015) |
| S1015 | 2 | 2 | (p028, . . . , p031) | (p024, . . . , p027) | (p020, . . . , p023) | (p016, . . . , p019) |
| S1016 | 2 | 1 | (p032, . . . , p035) | (p028, . . . , p031) | (p024, . . . , p027) | (p020, . . . , p023) |
| S1017 | 3 | 0 | (p032, . . . , p035) | (p028, . . . , p031) | (p024, . . . , p027) | (p020, . . . , p023) |
| S1018 | 3 | 0 | (p032, . . . , p035) | (p028, . . . , p031) | (p024, . . . , p027) | 00000000 |
| . . . | . . . | . . . | . . . | . . . | . . . | . . . |
| S1102 | 20 | 0 | (p236, . . . , p239) | (p232, . . . , p235) | (p228, . . . , p231) | (p224, . . . , p227) |
| S1103 | 20 | 0 | xxxxxxxx | (p236, . . . , p239) | (p232, . . . , p235) | (p228, . . . , p231) |
| S1104 | 20 | 0 | xxxxxxxx | xxxxxxxx | (p236, . . . , p239) | (p232, . . . , p235) |
| S1105 | 20 | 0 | xxxxxxxx | xxxxxxxx | xxxxxxxx | (p236, . . . , p239) |

Hereinbelow, a processing example (hereinafter, referred to as a first operation example) in which a Reed Solomon code (32, 20, d=13) with 8 bits taken as 1 symbol is encoded by using this embodiment, in a manner similar to that of the first preferred embodiment, will be described with reference to FIGS. 6 to 11 and Table 4. In this operation example, the number of information symbols "ninfo", is 20, and the number of parity symbols "nParity", is 12.

First of all, the initializing process of FIG. 6 will be described.

At step S11 of FIG. 6, the Galois field operation table "tGalois [nQueueLatch] [256]" is initialized. In the case of this preferred embodiment, the number "nQueueLatch" (=m) of 32-bit latches constituting the queue memory 72 is 3. When the minimum inter-code distance d is 13 in a manner similar to that of this operation example, the contents of the Galois field operation table "tGalois [nQueueLatch] [256]" are initialized to be transferred from the ROM 71 to the working RAM 63 so as to be identical to the contents stored in the ROM 14 of the first preferred embodiment as shown in Tables 1 and 2. Also, the 32-bit latches 73, 74, 75 and 69 are cleared to 0. This process corresponds to step S1001 in Table 4.

Subsequently, at step S12, the number of feeds "nFeed" of the queue memory 72, which can be represented by the following equation:

$$nFeed=nQueueLatch-(nParity+3)/4 \quad (31),$$

is computed, and is substituted into the number-of-feeds parameter "nFeed". In the case of this operation example, the number "nQueueLatch" of 32-bit latches constituting the queue memory 72 is 3, and the number "nParity" of parity symbols to be added is 12, so that the number of feeds "nFeed" of the queue memory 72 is initialized to 0.

Subsequently, at step S13, the number of writes "nQ" of the queue memory 72, which can be represented by the following equation:

$$nQ=(nParity+3)/4 \quad (32),$$

is computed and is written into the number-of-writes parameter "nQ". In the case of this operation example, since the number "nParity" of parity symbols to be added is 12, the number of writes "nQ" of the queue memory 72 is 3.

Subsequently, at step S14, the queue overflow symbol takeout position "index", which can be represented by the following equation:

$$index=((nParity+3) \text{ MOD } 4)+1 \quad (33),$$

is computed and substituted into the queue overflow symbol takeout position parameter "index". It is noted that the queue overflow symbol takeout position "index" represents a position where an 8-bit symbol is taken out from the nParity-th stage of the queue memory 72 in such a pseudo manner as it were overflowed, in order that the queue memory 72 will be operated as a queue of 8 bits×nParity stages. In the case of this operation example, since the number "nParity" of parity symbols to be added is 12, the queue overflow symbol takeout position "index" is 4. Thus, the initializing process is ended.

Next, an actual code word generating process will be described with reference to FIGS. 7 to 11.

First of all, at step S21 of FIG. 7, an information word is read out from the code word buffer BufB [ ], within the working RAM 63, and the parity word generated by this code word generating process is created on the queue memory 72. This process is referred to as a subroutine process P1.

Next, the details of the subroutine process P1 will be described concretely with reference to FIG. 8. First at step S31 of FIG. 8, an information symbol counter ant is initialized to 0. At step S32, an 8-bit information symbol "BufB [cnt]" of the cnt-th count value of the information symbol counter is read out from the code word buffer, and is taken as input data "inDataB". In this case, since the information symbol counter ant is 0, the input data inDataB is the head symbol of the code word buffer. Hereinafter, the head symbol taken out here is referred as $i_{000}$. Subsequently, at step S33, 32-bit data is read out from the 32-bit latch 73 which is the input port, and the byte data of the index-th (4th in this operation example) byte from the most significant byte, i.e., the less significant 8 bits are obtained. In this case, since the contents of the 32-bit latch 73 have been cleared to 00000000H, the less significant 8 bits are 00H. This corresponds to step S1002 in Table 4. Further, at step S34, the contents of the 32-bit latch 69 which is the output port, are cleared to 0. This corresponds to step S1003 in Table 4.

Subsequently, at step S35, the contents of the queue memory 72 are advanced by the number of feeds "nFeed" of the queue memory 72. In this process, data of the 32-bit latch 75 is written into the 32-bit latch 69, data of the 32-bit latch 74 is written into the 32-bit latch 75, and data of the 32-bit latch 73 is written into the 32-bit latch 74. It is noted that advancing by the number of feeds "nFeed essentially" device to iterate the write process from latch to latch to a number of times of nFeed. The data of the 32-bit latch 73 which is the input port is reserved or stored as it is. This process is referred to as a subroutine process P2.

Next, the contents of the subroutine process P2 will be described concretely with reference to FIG. 9. First of all, at step S41 of FIG. 9, the count value "cntFeed" of the feed counter of the queue memory 72 is initialized to a number of feeds "nFeed" of the queue memory 72. In this operation example, since the number of feeds "nFeed" is 0, the count value "cntFeed" is 0. Subsequently, at step S42, since the count value "cntFeed" of the feed counter of the queue memory 72 is 0, the subroutine process P2 is ended, the program flow returns to the original subroutine process P1 of FIG. 8. That is, in this operation example, no task is executed in the subroutine process P2.

At step S36 of FIG. 8, an EOR value between the input data "inDataB", and the data "pDataB" of the more less 8 bits of the 32-bit latch 73 obtained at step S33, is calculated, where the value of data of computing result "dataB" is referred to as $d_{000}$. In this case, since the data value is an EOR of the input data $i_{000}$ and the data of 00H, the data of computing result, $d_{000}$, can be expressed by the Equation (15). Subsequently, at step S37, the products of the computing result data dataB calculated at step S36 and the coefficients of the generator polynomial are read out from the Galois field operation table in the working RAM 63 and written into the queue memory 72. This process is referred to as a subroutine process P3.

Next, the contents of the subroutine process P3 will be described concretely with reference to FIG. 10. First of all, at step S51 of FIG. 10, the count value "cntWQ" of the queue write counter is initialized to 0. Next at step S52, the products on the Galois field of the data $d_{000}$ calculated at step S36 and the coefficients of the generator polynomial (the Equation (14)) are read out from the Galois field operation table in the working RAM 63 by 4 symbols (32 bits). It is noted that if the count value "cntWQ" of the queue write counter is 0, then $k_{12}$, $k_{11}$, $k_{10}$ and $k_9$ are selected as the coefficients of the generator polynomial (the Equation (14)). Subsequently, at step S53, the data of the products on the Galois field read out at step S52 are written into the queue memory 72. At this time, since the 32-bit latch 75 outputs data of 00000000H and the 8-bit latch 68 outputs data of 00H, the input data to the EOR computing units 64, 65, 66 and 67 are data (00H, 00H, 00H, 00H) and data ($k_{12} \cdot d_{000}$, $k_{11} d_{000}$, $k_{10} \cdot d_{000}$, $k_9 \cdot d_{000}$). Accordingly, if the output data from the EOR computing units 64, 65, 66 and 67 are ($p_{000}$, $p_{001}$, $p_{002}$, $p_{003}$), then this data value can be expressed by the Equation (19) in a manner similar to that of the first preferred embodiment. This corresponds to step S1004 in Table 4.

Subsequently, at step S54, the count value "cntWQ" of the queue write counter is incremented by 1. As a result, the count value "cntWQ" of the queue write counter becomes 1. Then, at step S55, if the count value "cntWQ" of the queue write counter is smaller than the number of queue writes "nQ", the program flow returns to step S52. On the other hand, if not, the subroutine process P3 is ended, then followed by a return. In this case, since the count value "cntWQ" of the queue write counter is 1 and the number of queue writes "nQ" is 3, the program flow returns to step S52.

Subsequently, at step S52, the products on the Galois field of data $d_{000}$ calculated at step S36 and the coefficients of the generator polynomial (the Equation (14)) are calculated by 4 symbols (32 bits). For this process, the Galois field operation table is used, where if the count value "cntWQ" of the queue write counter is 1, then $k_8$, $k_7$, $k_6$ and $k_5$ are selected as the coefficients of the generator polynomial (the Equation (14)). Further, at step S52, the data of the products calculated at step S52 are written into the queue memory 72. At this time, since the 32-bit latch 75 outputs the data of 00000000H and the 8-bit latch 68 outputs the data of 00H, the input data to the EOR computing units 64, 65, 66 and 67 are (00H, 00H, 00H, 00H) and data ($k_8 \cdot d_{000}$, $k_7 \cdot d_{000}$, $k_6 \cdot d_{000}$, $k_5 \cdot d_{000}$). Accordingly, if the output data of the EOR computing units 64, 65, 66 and 67 are ($p_{004}$, $p_{005}$, $p_{006}$, $p_{007}$), then this data value can be expressed by the Equation (21) in a manner similar to that of the first preferred embodiment. This corresponds to step S1005 in Table 4.

Subsequently, at step S54, the count value "cntWQ" of the queue write counter is incremented by 1. As a result, the count value "cntWQ" of the queue write counter becomes 2. Then, at step S55, if the count value "cntWQ" of the queue write counter is smaller than the number of queue writes "nQ", the program flow returns to step S52. On the other hand, if not, the subroutine process P3 is ended, followed by a return. In this case, since the count value "cntWQ" of the queue write counter is 2 and the number of queue writes "nQ" is 3, the program flow returns to step S52, but thereafter, and goes through step S52, step S53 and step S54 in a manner similar to that of the above-mentioned processes, the program flow goes to step S55 once again. At this time, since the count value "cntWQ" of the queue write counter is 3, the subroutine process P3 is ended, followed by a return to the subroutine process P1 of FIG. 8.

At step S38 of FIG. 8, the count value "cnt" of the information symbol counter is incremented by 1. As a result, the count value "cnt" of the information symbol counter becomes 1. Then, at step S39, if the count value "cnt" of the information symbol counter is smaller than the number of information symbols nInfo, the program flow returns to step S32. On the other hand, if not, the subroutine process P1 is ended, followed by a return. In this case, since the count value "cnt" of the information symbol counter is 1 and the number of information symbols nInfo is 20, the program flow returns to step S32.

At step S32, an information symbol "BufB [cnt]" of the cnt-th count value of the information symbol counter is read out from the code word buffer. In this case, since the count value "cnt" of the information symbol counter is 1, the read information symbol is the second symbol from the head symbol of the code word buffer. The second information symbol read out here is referred to as data of $i_{001}$. Subsequently, at step S33, 32-bit data is read out from the 32-bit latch 73, and byte data of the index-th (fourth in this operation example) byte from the most significant byte, i.e., the less significant 8-bit data are obtained. In this case, since the data of the 32-bit latch 73 are data ($p_{008}$, $p_{009}$, $P_{010}$, $P_{011}$), the less significant 8-bit data is $P_{011}$. This corresponds to step S1007 in able 4. Further, at step S34, the contents of the 32-bit latch 69 are cleared. This corresponds to step S1008 in Table 4.

Subsequently, at step S35, the contents of the queue memory 72 are advanced by the number of feeds "nFeed" of the queue memory 72. In this operation example, in a manner similar to that of above-mentioned processes, nothing is executed in the subroutine process P2. Further, at step S36, an EOR value between the input data "inDataB", and the data of the less significant 8 bits of the 32-bit latch 73 obtained at step S33 is computed, where the value of data of computing result is referred to as $d_{001}$. In this case, since the data value is an EOR of input data $i_{001}$ and data $p_{011}$, the data of computing result $d_{001}$ can be expressed by the Equation (16), in a manner similar to that of the first preferred embodiment. Further, at step S37, the subroutine process P3, in which the products of the data value calculated at step S36 and the coefficients of the generator polynomial are written into the queue memory 72, is executed.

Next, the contents of the subroutine process P3 will be described concretely with reference to FIG. 10.

First of all, at step S51 of FIG. 10, the count value "cntWQ" of the queue write counter is initialized to 0. At step S52, the products on the Galois field of the data $d_{001}$ calculated at step S36 and the coefficients of the generator polynomial (the Equation (14)) are calculated by 4 symbols (32 bits). For this process, the Galois field operation table is used, where if the count value "cntWQ" of the queue write counter is 0, then $k_{12}$, $k_{11}$, $k_{10}$ and $k_9$ are selected as the coefficients of the generator polynomial (the Equation (14)). Subsequently, at step S53, data of the results calculated at step S52 are written into the queue memory 72. At this time, since the 32-bit latch 75 outputs data ($P_{000}$, $P_{001}$, $P_{002}$, $P_{003}$) and the 8-bit latch 68 outputs the data of 00H, the input data to the EOR computing units 64, 65, 66 and 67 are data (00H, $p_{000}$, $p_{001}$, $p_{002}$) and data ($k_{12} \cdot d_{001}$, $k_{11} \cdot d_{001}$, $k_{10} \cdot d_{001}$, $k_9 \cdot d_{001}$). Accordingly, if the output data from the EOR computing units 64, 65, 66 and 67 are data ($p_{012}$, $p_{013}$, $p_{014}$, $P_{015}$), then this data value can be expressed by the Equation (25) in a manner similar to that of the first preferred embodiment. This corresponds to step S1009 in Table 4.

Subsequently, at step S54, the count value "cntWQ" of the queue write counter is incremented by 1. As a result, the count value "cntWQ" of the queue write counter becomes 1. Then, at step S55, if the count value "cntWQ" of the queue write counter is smaller than the number of queue writes "nQ", the program flow returns to step S52. On the other hand, if not, the subroutine process P3 is ended, followed by a return. In this case, since the count value "cntWQ" of the queue write counter is 1 and the number of queue writes "nQ" is 3, the program flow returns to step S52.

At step S52, the products on the Galois field of data $d_{001}$ calculated at step S36 and the coefficients of the generator polynomial (the Equation (14)) are calculated by 4 symbols (32 bits) For this process, the Galois field operation table is used, where if the count value "cntWQII of the queue write counter is 1, then $k_8$, $k_7$, $k_6$ and $k_5$ are selected as the coefficients of the generator polynomial (the Equation (14)). Further, at step S53, data of the results calculated at step S52 are written into the queue memory 72. At this time, since the 32-bit latch 75 outputs data ($p_{004}$, $p_{005}$, $p_{006}$, $p_{007}$) and the 8-bit latch 68 outputs data $P_{003}$, the input data to the EOR computing units 64, 65, 66 and 67 are data ($p_{003}$, $p_{004}$, $p_{005}$, $p_{006}$) and data ($k_8 \cdot d_{001}$, $k_7 \cdot d_{001}$, $k_6 \cdot d_{001}$, $k_5 \cdot d_{001}$). Accordingly, if the output data from the EOR computing units 64, 65, 66 and 67 are data ($p_{016}$, $p_{017}$, $p_{018}$, $p_{019}$), then this data value can be expressed by the Equation (27) in a manner similar to that of the first preferred embodiment. This corresponds to step S1010 in Table 4.

Subsequently, at step S54, the count value "cntWQ" of the queue write counter is incremented by 1. As a result, the count value "cntWQ" of the queue write counter becomes 2.

Then, at step S55, if the count value "cntWQ" of the queue write counter is smaller than the number of queue writes "nQ", the program flow returns to step S52. On the other hand, if not, the subroutine process P3 is ended, followed by a return. In this case, since the count value "cntWQ" of the queue write counter is 2 and the number of queue writes "nQ" is 3, the program flow returns to step S52. Thereafter, through step S52, step S53 and step S54 in a manner similar to that of the above-mentioned processes, the program flow goes to step S55 once again. At this time, since the count value "cntWQ" of the queue write counter is 3, the subroutine process P3 is ended, followed by a return to the subroutine process P1 of FIG. 8.

At step S38 of FIG. 8, the count value "cnt" of the information symbol counter is incremented by 1. As a result, the count value "cnt" of the information symbol counter becomes 2. Then, at step S39, if the count value "cnt" of the information symbol counter is smaller than the number of information symbols "nInfo", the program flow returns to step S32. On the other hand, if not, the subroutine process P1 is ended, followed by a return. In this case, since the count value "cnt" of the information symbol counter is 2 and the number of information symbols "nInfo" is 20, the program flow returns to step S32.

At step S32, an information symbol "BufB [cnt]" of the cnt-th count value of the information symbol counter is read out from the code word buffer. In this case, since the count value "cnt" of the information symbol counter is 2, the read information symbol is the third symbol from the head symbol of the code word buffer. The third information symbol from the head symbol taken out here is referred to as $i_{002}$. Subsequently, at step S33, 32-bit data is read out from the 32-bit latch 73, and byte data of the index-th (fourth in this operation example) byte from the most significant byte, i.e., the less significant 8 bits are obtained. In this case, since the contents of the 32-bit latch 73 are data ($p_{020}$, $p_{021}$, $p_{022}$, $p_{023}$), the less significant 8-bit data is $P_{023}$. This corresponds to step S1012 in Table 4. Further, at step S34, the contents of the 32-bit latch 69, which is the output port, are cleared. This corresponds to step S1013 in Table 4. Then, at step S35, the contents of the queue memory 72 are advanced by the number of feeds "nFeed" of the queue memory 72, where in this operation example, nothing is executed in the subroutine process P2 in a manner similar to that of the above-mentioned processes.

Subsequently, at step S36, an EOR value between the input data and the data of the less significant 8 bits of the 32-bit latch 73 obtained at step S33 is calculated, where the resulting data value is referred to as $d_{002}$. In this case, since the data value is an EOR of input data $i_{002}$ and data $P_{023}$, the data $d_{002}$ can be expressed by the Equation (30), in a manner similar to that of the first preferred embodiment. In this case, in a manner similar to that of above-mentioned process, the program flow goes on to step S37, step S38 and step S39, and further the processes from step S32 to step S39 are iterated until the count value "cnt" of the information symbol counter coincides with the number of information symbols "nInfo" (20 in this operation example). Thus, the subroutine process P1 is ended, followed by a return to the main routine of FIG. 7.

Then, at step S22 of FIG. 7, 32-bit data that have overflowed from the queue memory 72 are read out as dummy data. This corresponds to step S1102 in Table 4. Subsequently, at step S23, the contents of the queue memory 72 are advanced by the number of feeds "nFeed" of the queue memory 72. In this operation example, in a manner similar to that of the above-mentioned process, nothing is executed in the subroutine process P2. Subsequently, at step S24, parity symbols are read out from the queue memory 72 in a unit of 4 symbols, to "nParity" symbols in total, and then are stored in the parity word region of the code word buffer BufB [ ]. This process is referred to as a subroutine process P4.

Next, the contents of the subroutine process P4 will be described concretely with reference to FIG. 11. First of all, at step S61, the count value "cntRQ" of the queue read counter is initialized to 0. Subsequently, at step S62, parity symbols are read out from the queue memory 72 in a unit of 4 symbols. Then, at step S63, parity symbols corresponding to the 4 symbols (32 bits) taken out at step S62 are stored in the parity word region of the code word buffer. In this case, since the number of information symbols "nInfo" is 20 and the count value "cntRQ" of the queue read counter is 0, a position BufB [nInfo+cntRQ·4, . . . , nInfo+cntRQ·4+3] at which the parity symbols are stored to the code word buffer is BufB [20, . . . , 23]. In the case of this operation example, it is assumed that when data (a, b, c, d) corresponding to 4 symbols (=32 bits) are stored to the code word buffer BufB [i, . . . , i+3], data "a" is stored in BufB [i], data "b" is stored in BufB [i+1], data "c" is stored in BufB [i+2], and data "d" is stored in BufB [i+3].

Further, at step S64, the count value "cntRQ" of the queue read counter is incremented by 1. In this case, the count value "cntRQ" becomes 1. Then, at step S65, if the count value "cntRQ" of the queue read counter is smaller than the number of queue writes "nQ", the program flow returns to step S62. On the other hand, if not, the subroutine process P4 is ended, followed by a return. In this case, since the count value "cntRQ" is 1 and the number of queue writes "nQ" is 3, the program flow returns to step S62.

Next, at step S62, the parity symbols are read out from the queue memory 72 in a unit of 4 symbols. Then, at step S63, the parity symbols corresponding to the 4 symbols (32 bits) read out at step S62 are stored in the parity word region of the code word buffer. In this case, since the number of information symbols "nInfo" is 20 and the count value "cntRQ" of the queue read counter is 0, a position "BufB [nInfo+cntRQ·4, . . . , nInfo+cntRQ·4+3]" at which the parity symbols are stored to the code word buffer is BufB [24, . . . , 27]. Then, at step S64, the count value "cntRQ" of the queue read counter is incremented by 1. In this case, the count value "cntRQ" becomes 2. Further, at step S65, if the count value "cntRQ" of the queue read counter is smaller than the number of queue writes "nQ", the program flow returns to step S62. On the other hand, if not, the subroutine process P4 is ended, followed by a return. In this case, since the count value "cntRQ" is 2 and the number of writes "nQ" is 3, the program flow returns to step S62. Then, the processes of steps S62, S63 and S64 are iterated likewise, followed by going to step S65. At this time, since the count value "cntRQ" is 3 and the number of writes "nQ" is 3, the subroutine process P4 is ended, followed by a return to the original main routine. The subroutine process P4 corresponds to the processes of steps S1103, S1104 and S1105 in Table 4.

Now the code word generating process of RS (32, 20, d=13), which is the present operation example, is completed. It is noted that the code word has been stored in the code word buffer BufB [0, . . . , nInfo+nparity−1]. In this case, since the number of information symbols "nInfo" is 20 and the number of parity symbols "nparity" is 12, the code word has been stored in the code word buffer BufB [0, . . . , 31].

Next, a process of encoding a Reed-Solomon code RS (15, 10, d=6) which has a minimum inter-code distance d different from that of the foregoing first operation example and which takes 8 bits as 1 symbol by using the device for error correcting coding of the present preferred embodiment will be described with reference to FIGS. 5 to 11 and Table 5. This is taken as a second operation example.

It is noted that the primitive polynomial m(X) and the primitive element α are expressed by the Equation (12) and the Equation (13), respectively, in a manner similar to that of the first preferred embodiment, where the generator polynomial G(X) can be expressed by the following equation:

$$G(X) = \prod_{i=0}^{8} (X - \alpha^i) \qquad (34)$$

$$= k_1 \cdot X^8 + k_2 \cdot X^7 + \cdots + k_8 \cdot X + k_9$$

Accordingly, the second operation example differs in the value of coefficient $k_n$ ($1 \leq n \leq 5$) from the first preferred embodiment and the first operation example of this preferred embodiment.

Table 5 shows the statuses of the individual 32-bit latches of FIG. 5 in this operation example when the device for error correcting coding operates according to the flow charts of FIGS. 5 to 11. In FIG. 5, double underlines represent data write, and underlines represent data read. Also, the notation of parity symbols having data $p_{000}$ at their heads and symbols having data $d_{000}$ at their heads are values to be calculated by the calculation method as shown in FIG. 14, unlike the symbols in the first preferred embodiment and the first operation example of this preferred embodiment. In this operation example, the number of information symbols "nInfo" is 10 and the number of parity symbols "nParity" is 5.

TABLE 5

| Step | cnt | cntQ | Latch 73 | Latch 74 | Latch 75 | Latch 69 |
|------|-----|------|----------|----------|----------|----------|
| S2001 | — | — | 00000000 | 00000000 | 00000000 | 00000000 |
| S2002 | 0 | — | 00000000 | 00000000 | 00000000 | 00000000 |
| S2003 | 0 | — | 00000000 | 00000000 | 00000000 | 00000000 |
| S2004 | 0 | — | 00000000 | 00000000 | 00000000 | 00000000 |
| S2005 | 0 | 2 | (p000, . . . , p003) | 00000000 | 00000000 | 00000000 |
| S2006 | 0 | 1 | (p004, 00, 00, 00) | (p000, . . . , p003) | 00000000 | 00000000 |
| S2007 | 1 | 0 | (p004, 00, 00, 00) | (p000, . . . , p003) | 00000000 | 00000000 |
| S2008 | 1 | 0 | (p004, 00, 00, 00) | (p000, . . . , p003) | 00000000 | 00000000 |
| S2009 | 1 | 0 | 00000000 | (p004, 00, 00, 00) | (p000, . . . , p003) | 00000000 |
| S2010 | 1 | 2 | (p005, . . . , p008) | 00000000 | (p004, 00, 00, 00) | (p000, . . . , p003) |
| S2011 | 1 | 1 | (p009, 00, 00, 00) | (p005, . . . , p008) | 00000000 | (p004, 00, 00, 00) |
| S2012 | 2 | 0 | (p009, 00, 00, 00) | (p005, . . . , p008) | 00000000 | (p004, 00, 00, 00) |

TABLE 5-continued

| Step | cnt | cntQ | Latch 73 | Latch 74 | Latch 75 | Latch 69 |
|---|---|---|---|---|---|---|
| S2013 | 2 | 0 | (p009, 00, 00, 00) | (p005, . . . , p008) | 00000000 | 00000000 |
| S2014 | 2 | 0 | 00000000 | (p009, 00, 00, 00) | (p005, . . . , p008) | 00000000 |
| S2015 | 2 | 2 | (p010, . . . , p013) | 00000000 | (p009, 00, 00, 00) | (p005, . . . , p008) |
| S2016 | 2 | 1 | (p014, 00, 00, 00) | (p010, . . . , p013) | 00000000 | (p009, 00, 00, 00) |
| S2017 | 3 | 0 | (p014, 00, 00, 00) | (p010, . . . , p013) | 00000000 | (p009, 00, 00, 00) |
| S2018 | 3 | 0 | (p014, 00, 00, 00) | (p010, . . . , p013) | 00000000 | 00000000 |
| S2019 | 3 | 0 | 00000000 | (p014, 00, 00, 00) | (p101, . . . , p013) | 00000000 |
| . . . | . . . | . . . | . . . | . . . | . . . | . . . |
| S2052 | 10 | 0 | (p049, 00, 00, 00) | (p045, . . . , p048) | 00000000 | (p044, 00, 00, 00) |
| S2053 | 10 | 0 | xxxxxxxx | (p049, 00, 00, 00) | (p045, . . . , p048) | 00000000 |
| S2054 | 10 | 0 | xxxxxxxx | xxxxxxxx | (p049, 00, 00, 00) | (p045, . . . , p048) |
| S2055 | 10 | 0 | xxxxxxxx | xxxxxxxx | 00000000 | (p049, 00, 00, 00) |

Hereinbelow, an initializing process of the second operation example of this preferred embodiment will be described with reference to FIG. 6.

First of all, at step S11 of FIG. 6, the Galois field operation table "tGalois [nQueueLatch] [256]" is initialized. In the case of this operation example, the number "nQueueLatch" of 32-bit latches constituting the queue memory 72 is 3. When the minimum inter-code distance is 6 in a manner similar to that of this operation example, the contents of the Galois field operation table are initialized so as to be such contents as shown in Tables 6 and 7. Also, the 32-bit latches 73, 74, 75 and 69 are cleared to 0. This process corresponds to step S2001 in Table 5.

TABLE 6

| Address H | Address L | b[31, . . . , 24] | b[23, . . . , 16] | b[15, . . . , 8] | b[7, . . . , 0] |
|---|---|---|---|---|---|
| 0 | 00H | 0 | 0 | 0 | 0 |
| 0 | 01H | $k_5$ | $k_4$ | $k_3$ | $k_2$ |
| 0 | 02H | $k_5 \cdot \alpha$ | $k_4 \cdot \alpha$ | $k_3 \cdot \alpha$ | $k_2 \cdot \alpha$ |
| 0 | 03H | $k_5 \cdot \alpha^{25}$ | $k_4 \cdot \alpha^{25}$ | $k_3 \cdot \alpha^{25}$ | $k_2 \cdot \alpha^{25}$ |
| 0 | 04H | $k_5 \cdot \alpha^2$ | $k_4 \cdot \alpha^2$ | $k_3 \cdot \alpha^2$ | $k_2 \cdot \alpha^2$ |
| 0 | 05H | $k_5 \cdot \alpha^{50}$ | $k_4 \cdot \alpha^{50}$ | $k_3 \cdot \alpha^{50}$ | $k_2 \cdot \alpha^{50}$ |
| . . . | . . . | . . . | . . . | . . . | . . . |
| 0 | FBH | $k_5 \cdot \alpha^{234}$ | $k_4 \cdot \alpha^{234}$ | $k_3 \cdot \alpha^{234}$ | $k_2 \cdot \alpha^{234}$ |
| 0 | FCH | $k_5 \cdot \alpha^{168}$ | $k_4 \cdot \alpha^{168}$ | $k_3 \cdot \alpha^{168}$ | $k_2 \cdot \alpha^{168}$ |
| 0 | FDH | $k_5 \cdot \alpha^{80}$ | $k_4 \cdot \alpha^{80}$ | $k_3 \cdot \alpha^{80}$ | $k_2 \cdot \alpha^{80}$ |
| 0 | FEH | $k_5 \cdot \alpha^{88}$ | $k_4 \cdot \alpha^{88}$ | $k_3 \cdot \alpha^{88}$ | $k_2 \cdot \alpha^{88}$ |
| 0 | FFH | $k_5 \cdot \alpha^{175}$ | $k_4 \cdot \alpha^{175}$ | $k_3 \cdot \alpha^{175}$ | $k_2 \cdot \alpha^{175}$ |
| 1 | 00H | 0 | 0 | 0 | 0 |
| 1 | 01H | $k_1$ | 0 | 0 | 0 |
| 1 | 02H | $k_1 \cdot \alpha$ | 0 | 0 | 0 |
| 1 | 03H | $k_1 \cdot \alpha^{25}$ | 0 | 0 | 0 |
| 1 | 04H | $k_1 \cdot \alpha^2$ | 0 | 0 | 0 |
| 1 | 05H | $k_1 \cdot \alpha^{50}$ | 0 | 0 | 0 |
| . . . | . . . | . . . | . . . | . . . | . . . |
| 1 | FBH | $k_1 \cdot \alpha^{234}$ | 0 | 0 | 0 |
| 1 | FCH | $k_1 \cdot \alpha^{168}$ | 0 | 0 | 0 |
| 1 | FDH | $k_1 \cdot \alpha^{80}$ | 0 | 0 | 0 |
| 1 | FEH | $k_1 \cdot \alpha^{88}$ | 0 | 0 | 0 |
| 1 | FFH | $k_1 \cdot \alpha^{175}$ | 0 | 0 | 0 |

TABLE 7

| Address H | Address L | b[31, . . . , 24] | b[23, . . . , 16] | b[15, . . . , 8] | b[7, . . . , 0] |
|---|---|---|---|---|---|
| 2 | 00H | 0 | 0 | 0 | 0 |
| 2 | 01H | 0 | 0 | 0 | 0 |
| 2 | 02H | 0 | 0 | 0 | 0 |
| 2 | 03H | 0 | 0 | 0 | 0 |
| 2 | 04H | 0 | 0 | 0 | 0 |
| 2 | 05H | 0 | 0 | 0 | 0 |
| . . . | . . . | . . . | . . . | . . . | . . . |
| 2 | FBH | 0 | 0 | 0 | 0 |
| 2 | FCH | 0 | 0 | 0 | 0 |
| 2 | FDH | 0 | 0 | 0 | 0 |
| 2 | FEH | 0 | 0 | 0 | 0 |
| 2 | FFH | 0 | 0 | 0 | 0 |

Next, at step S12, the number of feeds "nfeed" of the queue memory 72 represented by the Equation (31) is calculated. In this operation example, since the number "nQueueLatch" of 32-bit latches constituting the queue memory 72 is 3 and the number "nParity" of parity symbols to be added is 5, the number of feeds "nFeed" of the queue memory 72 becomes 1. Then, at step S13, the number of writes "nQ" of the queue memory 72 represented by the Equation (32) is calculated. In this operation example, since the number "nparity" of parity symbols to be added is 5, the number of writes "nQ" of the queue memory 72 becomes 2. Further, at step S14, a queue overflow symbol takeout position "index" represented by the Equation (33) is calculated. In this operation example, since the number "nParity" of parity symbols to be added is 5, the queue overflow symbol takeout position "index" becomes 1. Thus, the initializing process is ended.

Next, an actual code word generating process will be described with reference to FIGS. 7 to 11. First of all, at step S21 of FIG. 7, an information word is read out from the code word buffer BufB [ ], within the working RAM 63, and a subroutine process PI for generating a parity word on the queue memory 72 is executed. The contents of this subroutine process P1 will be described concretely with reference to FIG. 8.

First of all, at step S31 of FIG. 8, the count value "cnt" of the information symbol counter is initialized to 0. Then, at step S32, an information symbol "BufB [cnt]" of the information-symbol-counter count value cnt-th information symbol "BufB [cnt]" is read out from the code word buffer. In this case, since the count value "cnt" of the information symbol counter is 0, the read information symbol is the leading head symbol of the code word buffer. Hereinafter, the head information symbol read out here is referred to as data $i_{000}$. Further, at step S33, 32-bit data is read out from the 32-bit latch 73, and byte data of the index-th (first in this operation example) byte as counted from the most significant byte, i.e., the more significant 8 bits are obtained. In this case, since the contents of the 32-bit latch 73 have been cleared to be 00000000H, the data of the more significant 8 bits is the data of 00H. This corresponds to step S2002 in Table 5. Subsequently, at step S34, the contents of the 32-bit latch 69 are cleared to 0. This corresponds to step S2003 in Table 5. Further, at step S35, a subroutine process P2 in which the contents of the queue memory 72 are advanced to the number of feeds "nFeed" of the queue memory 72 is executed.

Next, this subroutine process P2 will be described concretely with reference to FIG. 9. First of all, at step S41, the count value "cntFeed" of the feed counter of the queue memory 72 is initialized to a number of feeds "nFeed" of the queue memory 72. In this operation example, since the number of feeds "nFeed" is 1, the count value "cntFeed" is 1. Subsequently, at step S42, if the count value "cntFeed" of the feed counter of the queue memory 72 is larger than 0, the program flow goes to step S43. On the other hand, if not, the subroutine process P2 is ended, followed by a return. In this case, since the count value "cntFeed" is 1, the program flow goes to step S43. However, the contents of the 32-bit latch 69 are kept as they are. This corresponds to step S2004 in Table 5. Subsequently, at step S44, the count value "cntFeed" of the feed counter of the queue memory 72 is decremented by 1. In this case, the count value "cntFeed" becomes 0. Then, at step S42, if the count value "cntFeed" of the feed counter of the queue memory 72 is larger than 0, the program flow goes to step S43. On the other hand, if not, the subroutine process P2 is ended, followed by a return. In this case, since the count value "cntFeed" is 0, the subroutine process P2 is ended, followed by a return to the subroutine process P1 of FIG. 8.

At step S36 of FIG. 8, an EOR value between the input data and the data of the more significant 8 bits of the 32-bit latch 73 obtained at step S33 is calculated, where the resulting data value is referred to as $d_{000}$. In this case, the data dooo value is an EOR of input data $i_{000}$ and the data of 00H, so that the data $d_{000}$ can be expressed by the following equation:

$$d_{000}=i_{000} \tag{35}$$

Subsequently, at step S37, a subroutine process P3 in which the products of the data value calculated at step S36 and the coefficients of the generator polynomial are written into the queue memory 72 is executed. Hereinbelow, this subroutine process P3 will be described concretely with reference to FIG. 10.

First of all, at step S51 of FIG. 10, the count value "cntWQ" of the queue write counter is initialized to 0. At step S52, the products on the Galois field of the data $d_{000}$ calculated at step S56 and the coefficients of the generator polynomial (the Equation (34)) are calculated by 4 symbols (32 bits). For this process, the Galois field operation table is used, where if the count value "cntWQ" of the queue write counter is 0, then $k_5$, $k_4$, $k_3$ and $k_2$ are selected as the coefficients of the generator polynomial (the Equation (34)). Further, at step S53, data of computing results calculated at step S52 are written into the queue memory 72. At this time, since the 32-bit latch 75 outputs the data of 00000000H and the 8-bit latch 68 outputs the data of 00H, the input data to the EOR computing units 64, 65, 66 and 67 are data (00H, 00H, 00H, 00H) and data ($k_5 \cdot d_{000}$, $k_4 \cdot d_{000}$, $k_3 \cdot d_{000}$, $k_2 \cdot d_{000}$). Accordingly, if output data from the EOR computing units 64, 65, 66 and 67 are ($p_{000}$, $p_{001}$, $p_{002}$, $p_{003}$), then this data can be expressed by the following equation:

$$(p_{000}, p_{001}, p_{002}, p_{003})=(k_5 \cdot d_{000}, k_4 \cdot d_{000}, k_3 \cdot d_{000}, k_2 \cdot d_{000}) \tag{36}$$

This corresponds to step S2005 in Table 5.

Subsequently, at step S54, the count value "cntWQ" of the queue write counter is incremented by 1. As a result, the count value "cntWQ" of the queue write counter becomes 1. Then, at step S55, if the count value "cntWQ" of the queue write counter is smaller than the number of queue writes "nQ", the program flow returns to step S52. On the other hand, if not, the subroutine process P3 is ended, followed by a return. In this case, since the count value "cntWQ" of the queue write counter is 1 and the number of queue writes "nQ" is 2, the program flow returns to step S52.

At step S52, products on the Galois field of data $d_{000}$ calculated at step S36 and the coefficients of the generator polynomial (the Equation (34)) are calculated by 4 symbols (32 bits). For this process, the Galois field operation table is used, where if the count value "cntWQ" of the queue write counter is 1, then $k_1$, 0, 0 and 0 are selected as the coefficients of the generator polynomial (the Equation (14)). Further, at step S53, data of the results calculated at step S52 are written into the queue memory 72. At this time, since the 32-bit latch 75 outputs the data of 00000000H and the 8-bit latch 68 outputs the data of 00H, the input data to the EOR computing units 64, 65, 66 and 67 are (00H, 00H, 00H, 00H) and data ($k_1 \cdot d_{000}$, 00H, 00H, 00H). Accordingly, if the output data from the EOR computing units 64, 65, 66 and 67 are ($p_{004}$, 00H, 00H, 00H), then the data $p_{004}$ can be expressed by the following equation:

$$p_{004}=k_1 \cdot d_{000} \tag{37}$$

This corresponds to step S2006 in Table 5.

Subsequently, at step S54, the count value "cntWQ" of the queue write counter is incremented by 1. As a result, the count value "cntWQ" of the queue write counter becomes 2. Then, at step S55, if the count value "cntWQ" of the queue write counter is smaller than the number of queue writes "nQ", the program flow returns to step S52. On the other hand, if not, the subroutine process P3 is ended, followed by a return. In this case, since the count value "cntWQ" of the queue write counter is 2 and the number of queue writes "nQ" is 2, the subroutine process P3 is ended, followed by a return to the subroutine process P1 of FIG. 8.

At step S38 of FIG. 8, the count value "cnt" of the information symbol counter is incremented by 1. As a result, the count value "cnt" of the information symbol counter becomes 1. Then, at step S39, if the count value "cnt" of the information symbol counter is smaller than the number of information symbols "nInfo", the program flow returns to step S32. On the other hand, if not, the subroutine process P1 is ended. In this case, since the count value "cnt" of the information symbol counter is 1 and the number of information symbols "nInfo" is 10, the program flow returns to step S32.

At step S32, the information-symbol-counter count value cnt-th information symbol "BufB [cnt]" is read out from the code word buffer. In this case, since the count value "cnt" of the information symbol counter is 1, the read information symbol is the second symbol from the head symbol of the code word buffer. The second information symbol read out here is referred to as data $i_{001}$. Subsequently, at step S33, 32-bit data is read out from the 32-bit latch 73, and the byte data of the index-th (first in this operation example) byte from the most significant byte, i.e., the more significant 8 bits are obtained. In this case, since the contents of the 32-bit latch 73 are ($p_{004}$, 00H, 00H, 00H), the more significant 8-bit data is $p_{004}$. This corresponds to step S2007 in Table 5. Subsequently, at step S34, the contents of the 32-bit latch 69 are cleared to 0. This corresponds to step S2008 in Table 5.

Further, at step S35, a subroutine process P2 in which the contents of the queue memory 72 are advanced by the number of feeds "nFeed" of the queue memory 72 is executed. In this subroutine process P2, in a manner similar to that of the above-mentioned process, the queue memory 72 is advanced only once. This corresponds to step S2009 in Table 5. Then, at step S36 of FIG. 8, an EOR value between the input data and the data of the more significant 8 bits of the 32-bit latch 73 obtained at step S33 is calculated, where the resulting data value is referred to as $d_{001}$. In this case, since the data value is an EOR of input data $i_{001}$ and data $p_{004}$, the data $d_{001}$ can be expressed by the following equation:

$$d_{001}=i_{001}+p_{004} \qquad (38)$$

Subsequently, at step S37, the subroutine process P3, in which products of the data value calculated at step S36 and the coefficients of the generator polynomial are written into the queue memory 72, is executed. Hereinbelow, this subroutine process P3 will be described concretely with reference to FIG. 10.

First of all, at step S51 of FIG. 10, the count value "cntWQ" of the queue write counter is initialized to 0. At step S52, the products on the Galois field of the data $d_{001}$ calculated at step S36 and the coefficients of the generator polynomial (the Equation (34)) are calculated by 4 symbols (32 bits). For this process, the Galois field operation table is used, where if the count value "cntWQ" of the queue write counter is 0, then $k_5$, $k_4$, $k_3$ and $k_2$ are selected as the coefficients of the generator polynomial (the Equation (34)).

Further, at step S53, data of results calculated at step S52 are written into the queue memory 72. At this time, since the 32-bit latch 75 outputs data ($p_{000}$, $p_{001}$, $p_{002}$, $p_{003}$) and the 8-bit latch 68 outputs the data of 00H, the input data to the EOR computing units 64, 65, 66 and 67 are data (00H, $p_{000}$, $p_{001}$, $p_{002}$) and data ($k_5 \cdot d_{001}$, $k_4 \cdot d_{001}$, $k_3 \cdot d_{001}$, $k_2 \cdot d_{001}$). Accordingly, if the output data from the EOR computing units 64, 65, 66 and 67 are ($p_{005}$, $p_{006}$, $p_{007}$, $p_{008}$), then this output data can be expressed by the following equation:

$$\begin{aligned}(p_{005}, p_{006}, p_{007}, p_{008}) &= (k_5 \cdot d_{001}, k_4 \cdot d_{001} + p_{000}, \\ &\quad k_3 \cdot d_{001} + p_{001}, k_2 \cdot d_{001} + p_{002})\end{aligned} \qquad (39)$$

This corresponds to step S2010 in Table 5.

Subsequently, at step S54, the count value "cntWQ" of the queue write counter is incremented by 1. As a result, the count value "cntWQ" of the queue write counter becomes 1. Then, at step S55, if the count value "cntWQ" of the queue write counter is smaller than the number of queue writes "nQ", the program flow returns to step S52. On the other hand, if not, the subroutine process P3 is ended. In this case, since the count value "cntWQ" of the queue write counter is 1 and the number of queue writes "nQ" is 2, the program flow returns to step S52.

At step S52, products on the Galois field of data $d_{001}$ calculated at step S36 and the coefficients of the generator polynomial (the Equation (34)) are calculated by 4 symbols (32 bits). For this process, the Galois field operation table is used, where if the count value "cntWQ" of the queue write counter is 1, then $k_1$, 0, 0 and 0 are selected as the coefficients of the generator polynomial (the Equation (14)). Subsequently, at step 553, data of the results calculated at step S52 are written into the queue memory 72. At this time, since the 32-bit latch 75 outputs data ($p_{004}$, 00H, 00H, 00H) and the 8-bit latch 68 outputs $p_{003}$, the input data to the EOR computing units 64, 65, 66 and 67 are data ($p_{003}$, $p_{004}$, 00H, 00H) and data ($k_1 \cdot d_{001}$, 00H, 00H, 00H). Accordingly, if the output data from the EOR computing units 64, 65, 66 and 67 are ($p_{009}$, $p_{004}$, 00H, 00H), then the data $p_{009}$ can be expressed by the following equation:

$$p_{009}=k_1 \cdot d_{001}+p_{003} \qquad (40)$$

This corresponds to step S2011 in Table 5.

Subsequently, at step S54 of FIG. 10, the count value "cntWQ" of the queue write counter is incremented by 1. As a result, the count value "cntWQ" of the queue write counter becomes 2. Then, at step S55, if the count value "cntWQ" of the queue write counter is smaller than the number of queue writes "nQ", the program flow returns to step S52. On the other hand, if not, the subroutine process P3 is ended, followed by a return. In this case, since the count value "cntWQ" of the queue write counter is 2 and the number of queue writes "nQ" is 2, the subroutine process P3 is ended, followed by a return to the subroutine process P1 of FIG. 8.

At step S38 of FIG. 8, the count value "cnt" of the information symbol counter is incremented by 1. As a result, the count value "cnt" of the information symbol counter becomes 2. Then, at step S39, if the count value "cnt" of the information symbol counter is smaller than the number of information symbols "nInfo", the program flow returns to step S32. On the other hand, if not, the subroutine process P1 is ended, followed by a return. In this case, since the count value "cnt" of the information symbol counter is 2 and the number of information symbols "nInfo" is 10, the program flow returns to step S32.

At step S32, the information-symbol-counter count value cnt-th information symbol "BufB [cnt]" is read out from the code word buffer within the working RAM 63. In this case, since the count value "cnt" of the information symbol counter is 2, the read information symbol is the third symbol from the head symbol of the code word buffer. The third information symbol taken out here is referred to as data $i_{002}$. Subsequently, at step S33, 32-bit data is taken out from the 32-bit latch 73, and the byte data of the index-th (first in this operation example) byte from the most significant byte, i.e., more significant 8-bit data is obtained. In this case, since the contents of the 32-bit latch 73 are ($p_{009}$, $p_{004}$, 00H, 00H), the more significant 8-bit data is $p_{009}$. This corresponds to step S2012 in Table 5. Further, at step S34, the contents of the 32-bit latch 69 are cleared to 0. This corresponds to step S2013 in Table 5.

Subsequently, at step S35, a subroutine process P2 in which the contents of the queue memory 72 are advanced by the number of feeds "nFeed" of the queue memory 72 is executed. In this subroutine process P2, in a manner similar to that of the above-mentioned process, the queue memory 72 is advanced only once. This corresponds to step S2014 in Table 5.

Subsequently, at step S36 of FIG. 8, an EOR value between the input data and the data of the more significant 8 bits of the 32-bit latch 73 obtained at step S33 is calculated, where the resulting data value is referred to as $d_{002}$. In this case, since the data value is an EOR of input data $i_{002}$ and data $p_{009}$, the data $d_{002}$ can be expressed by the following equation:

$$d_{002}=i_{002}+p_{009} \qquad (41)$$

Then, in a manner similar to that of the above-mentioned process, the program flow goes on to step S37, step S38 and step S39, and further the processes from step S32 to step S39 are iterated until the count value "cnt" of the information symbol counter coincides with the number of information symbols "nInfo" (nInfo=10 in this operation example). Thus, the subroutine process P1 is ended, followed by a return to the main routine of FIG. 7.

Then, at step S22 of FIG. 7, 32-bit data that have overflowed from the queue memory 72 are read out as dummy data. This corresponds to step S2052 in Table 5. Subsequently, at step S23, a subroutine process P2 in which the contents of the queue memory 72 are advanced by the number of feeds "nFeed" of the queue memory 72 is executed. In this subroutine process P2, in a manner similar to that of the above-mentioned process, the queue memory 72 is advanced only once. This corresponds to step S2053 in Table 5.

Subsequently, at step S24 of FIG. 7, a subroutine process P4 is executed in which parity symbols are read out from the queue memory 72 in a unit of 4 symbols, to "nparity" symbols in total, and stored in the parity word region of the code word buffer "BufB [ ]" within the working RAM 63. Next, the contents of the subroutine process P4 will be described concretely with reference to FIG. 11.

First of all, at step S61 of FIG. 11, the count value "cntRQ" of the queue read counter is initialized to 0. At step S62, parity symbols are read out from the queue memory 72 in a unit of 4 symbols. Then, at step S63, parity symbols corresponding to the 4 symbols (32 bits) taken out at step S62 are stored in the parity word region of the code word buffer within the working RAM 63. In this case, since the number of information symbols "nInfo" is 10 and the count value "cntRQ" of the queue read counter is 0, a position BufB [nInfo+cntRQ·4, . . . , nInfo+cntRQ·4+3] where the parity symbols are stored to the code word buffer is BufB [10, . . . , 13]. Then, at step S64, the count value "cntRQ" of the queue read counter is incremented by 1. In this case, the count value "cntRQ" becomes 1. Then, at step S65, if the count value "cntRQ" of the queue read counter is smaller than the number of queue writes "nQ", the program flow returns to step S62. On the other hand, if not, the subroutine process P4 is ended, followed by a return. In this case, since the count value "cntRQ" is 1 and the number of queue writes "nQ" is 2, the program flow returns to step S62.

At step S62, parity symbols are read out from the queue memory 72 in a unit of 4 symbols. Then, at step S63, parity symbols corresponding to the 4 symbols (32 bits) read out at step S62 are stored in the parity word region of the code word buffer within the working RAM 63. In this case, since the number of information symbols "nInfo" is 10 and the count value "cntRQ" of the queue read counter is 1, a position BufB [nInfo+cntRQ·4, . . . , nInfo+cntRQ·4+3] where the parity symbols are stored to the code word buffer is BufB [14, . . . , 17]. Further, at step S64, the count value "cntRQ" of the queue read counter is incremented by 1. In this case, the count value "cntRQ" becomes 2. Subsequently, at step S65, if the count value "cntRQ" of the queue read counter is smaller than the number of queue writes "nQ", the program flow returns to step S62. On the other hand, if not, the subroutine process P4 is ended, followed by a return. In this case, since the count value "cntRQ" is 2 and the number of queue writes "nQ" is 2, the subroutine process P4 is ended, followed by a return to the main routine. This subroutine process P4 corresponds to steps S2054 and S2055 in Table 5.

Now the code word generating process of RS (15, 10, d=6), which is the present operation example, is completed. It is noted that the code word has been stored in the code word buffer BufB [0, . . . , nInfo+nParity−1]. In this case, since the number of information symbols "nInfo" is 10 and the number of parity symbols "nParity" is 5, the code word has been stored in the code word buffer BufB [0, . . . , 14].

The second preferred embodiment presented above can produce the following effects in addition to the effects as shown in the first preferred embodiment. The product data on the Galois field of input data and coefficients of the generator polynomial are previously computed and stored in the ROM 71, and are transferred to the working RAM 63 in the initializing process, where the working RAM 63 constitutes a coefficient storage device. The circuit device of FIGS. 3 and 4 is so arranged as to be capable of reading out product data of 4 symbols at the same time from the working RAM 63 serving as coefficient storage device. Also, the first storage device and the selecting device are implemented by using the queue memory 72, which comprises m-stage 32-bit latches 72-1 to 72-m, the second storage device is implemented by using the 8-bit latch 68. Further, the EOR operation device is implemented by using the 8-bit EOR computing units 64, 65, 66 and 67, and the read control device and the first and second selecting device are implemented by using the CPU 61 and the latch control circuit 62 that execute the programs stored in the ROM 71.

Therefore, the circuit configuration of the device for error correcting coding can be simplified, while the Reed-Solomon code RS (n, n−P, d=P+1) can be encoded for any arbitrary P that is equal to or larger than 1 and not more than 4×m. For instance, if m=16, then the minimum inter-code distance d can be set freely over a range of 2 to 65. Since the Galois field operation table including product data on the Galois field is set by being transferred from the ROM 71 onto the working RAM 63 in the initializing process, changes in the primitive polynomial as well as changes in the minimum inter-code distance d of code words can be made without changing the circuit configuration of the device, by changing the product data to be transferred as well as the initializing parameters (in this preferred embodiment, the number of 32-bit latches "nQueueLatch", and the number of parity symbols "nParity") in the initializing process. Also, since the code word buffer is provided on the working RAM 63, various types of error correcting codes such as the product code can be encoded by changing the contents of the information symbol capturing process, as well as the contents of the parity symbol storing process, in the programs stored in the ROM 71. Furthermore, making such changes in programs also produces a further unique effect that the switching between LDC and product code can also be accomplished without changing the circuit configuration of the device.

Third Preferred Embodiment

Figure 15:
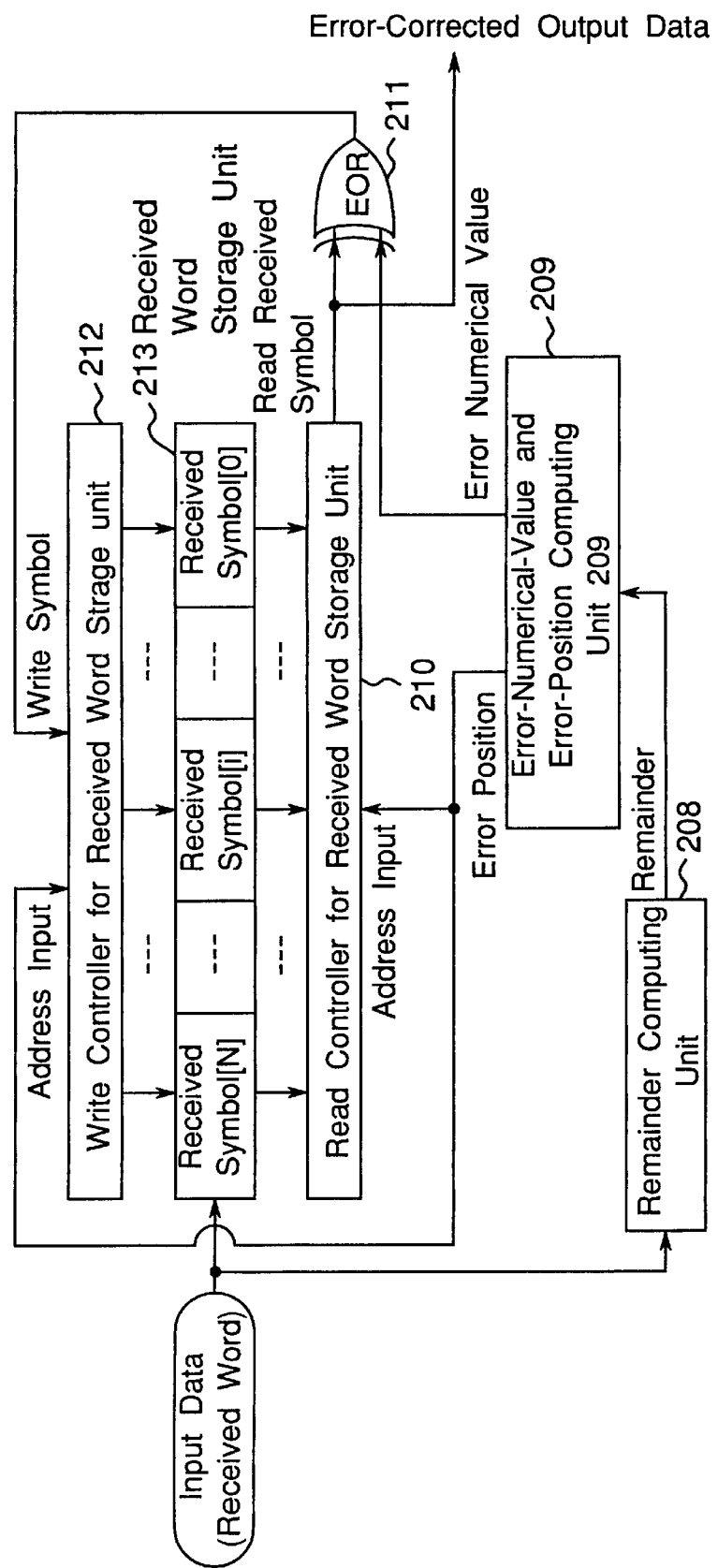
FIG. 15 is a block diagram of a device for error correcting decoding of a third preferred embodiment according to the present invention.

FIG. 15 is a block diagram showing an arrangement of a device for error correcting decoding of a third preferred embodiment according to the present invention. As shown in FIG. 15, the device for error correcting decoding of this third preferred embodiment comprises:

(a) a remainder computing unit 208 having the same configuration as the device for error correcting coding shown in FIG. 3;

(b) an error-numerical-value and error-position computing unit 209;

(c) a read controller 210 for received word storage unit;

(d) an EOR computing unit 211;

(e) a write controller 212 for received word storage unit; and (f) a received word storage unit 213 comprising shift registers having a plurality of N latches connected in series.

Hereinbelow, the error correcting process of a Reed-Solomon code RS (N, N−2t, d=2t+1) will be described with reference to FIG. 15.

First of all, a process of computing the syndrome will be described. The generator polynomial of the Reed-Solomon code RS (N, N−2t, d=2t+1) can be expressed by the following equation:

$$G(X)=(X-\alpha^0)(X-\alpha^1)\ldots(X-\alpha^{2t-1}) \tag{42}$$

Here, if a code word A to be received is represented as an array of code symbols $a_i$ by the following equation:

$$A=(a_0,a_1,a_2,\ldots,a_{n-1}) \tag{43}$$

and if an error pattern E upon the reception is represented as an array of error symbols $e_i$ by the following equation:

$$E=(e_0,e_1,e_2,\ldots,e_{n-1}) \tag{44}$$

and if a received word Y is represented as an array of received symbols $y_i$ by the following equation:

$$Y=(y_0,y_1,y_2,\ldots,y_{n-1}) \tag{45}$$

then the code polynomial A(X) is defined as follows:

$$A(X)=a_0+a_1 \cdot X+a_2 \cdot X^2+\ldots+a_{n-1} \cdot X^{n-1} \tag{46}$$

and the error polynomial E(X) is defined as follows:

$$E(X)=e_0+e_1 \cdot X+e_2 \cdot X^2+\ldots+e_{n-1} \cdot X^{n-1} \tag{47}$$

and the reception polynomial Y(X) is defined as follows:

$$Y(X)=y_0+y_1 \cdot X+y_2 \cdot X^2+\ldots+y_{n-1} \cdot X^{n-1} \tag{48}$$

Since the received word Y is such that the error pattern E has been added to the code word A to be received, the reception polynomial Y(X) can be expressed as follows:

$$Y(X)=A(X)+E(X) \tag{49}$$

Here, a remainder polynomial r(X) is defined as follows:

$$r(X)=[Y(X)] \text{ MOD } G(X) \tag{50}$$

where "A MOD B" is an operator for computing the remainder of dividing A by B. The code word A(X) can be divided out by the generator polynomial G(X), so that the following equation can be obtained from the Equations (49) and (50):

$$r(X)=[E(X)] \text{ MOD } G(X) \tag{51}$$

Also, by using the following equation that is obtained by developing the Equation (51)

$$r(X)=r_0+r_1 \cdot X+r_2 \cdot X^2+\ldots+r_{2t-1} \cdot X^{2t-1} \tag{52}$$

a remainder vector that is a vector representation in which the coefficients of the remainder polynomial r(X), $r_0$, $r_1$, $r_2$, . . . and $r_{2t-1}$, are arrayed is expressed by the following equation:

$$r=(r_0,r_1,r_2,\ldots,r_{2t-1}) \tag{53}$$

It can be understood that the remainder polynomial r(X), which is the remainder of dividing the reception polynomial Y(X) by the generator polynomial G(X), can be calculated by the same method as that of calculating the parity polynomial R(X) that is the remainder of dividing the information polynomial I(X) by the generator polynomial G(X). That is, upon inputting the received word Y to the device for error correcting coding, a remainder vector r in place of a parity word is obtained as the remainder of dividing the inputted received word Y by the generator polynomial G(X).

As described above, the device for error correcting coding of the second preferred embodiment can be employed as the remainder computing unit 208. Once the remainder vector r is obtained, a generalization syndrome S(X) can be computed by using the following equation:

$$S(X) = \sum_{i=0}^{2t-1} [r_i \cdot (G(X) - G(\alpha^i))/(X - \alpha^i)] \tag{54}$$

(See, for example, prior art document, K'yomichi Araki et al., "Generalized syndrome polynomial for decoding the Reed-Solomon code," Proceedings of 1991 Spring Conference of the Institute of Electronics, Information and Communication Engineers of Japan, A-278, pp. 1–280, 1991"). Therefore, when the received word Y is inputted to the remainder computing unit 208, which is the device for error correcting coding of the second preferred embodiment, and the computation of the Equation (54) is performed, the generalized syndrome S(X) can be obtained as an output.

Next, the process of calculating an error numerical value and an error position will be described. It is assumed here that errors have occurred to L positions $(j_1, j_2, \ldots, j_L)$, where $L \leq t$ and $0 \leq j_1 < j_2 < \ldots < j_L \leq n-1$.

From the Equation (54), sets of an error numerical value an and error position, $(e_{j_n}, j_n)$ n=1, 2, . . . , L, can be calculated by using Welch and Berlekamp's method (See, for example, U.S. Pat. No. 4,633,470) or the known Euclidean algorithm or similar method. When the remainder vector r is inputted to the error-numerical-value and error-position computing unit 209 from the remainder computing unit 208, the error-numerical-value and error-position computing unit 209 calculates the sets of error numerical value and error position, ($e_{jn}$, $j_n$), by the above-mentioned known method, and outputs the sets of error numerical value and error position, ($e_{jn}$, $j_n$), sequentially, from n=1 to n=L (L≦t). In this operation, the data of error numerical values are outputted to the second input terminal of the EOR computing unit 211, while the data of error positions are outputted, as addresses, to the read controller 210 for received word storage unit and the write controller 212 for received word storage unit.

Further, the error correcting process will be described. Whereas the error-numerical-value and error-position computing unit 209 outputs sets of an error numerical value and an error position, ($e_{jn}$, $j_n$) any error is corrected by adding an error numerical value $e_{jn}$ to the received symbol $y_{jn}$ located at the error position $j_n$. For this purpose, the following processes are carried out. First of all, an error position $j_n$ is inputted, as an address, to the read controller 210 for received word storage unit that controls the data read operation of the received word storage unit 213, and the received symbol $Y_{jn}$ located at the error position $j_n$ is read out from the received word storage unit 213. The read received symbol $Y_{jn}$, as well as an error numerical value $e_{jn}$ corresponding thereto, are inputted to the EOR computing unit 211, by which the sum ($y_{jn}+e_{jn}$) of the received symbol $Y_{jn}$ and the error numerical value $e_{jn}$ is obtained as output data. Since this output data ($y_{jn}+e_{jn}$) becomes a corrected code symbol $a_{jn}$, this corrected code symbol $a_{jn}$ is written into the received word storage unit 213 with handling the origin error position $j_n$ as the address and by using the write controller 212 for received word storage unit that controls the data write operation of the received word storage unit 213. These processes are iterated until the error-numerical-value and error-position computing unit 209 has outputted the sets of the error numerical value and the error position ($e_{jn}$, $j_n$), sequentially from n=1 to n=L (L≦t), by which the error correction can be executed on all the received words so that the error decoding process can be completed. As a result, an error-corrected code word A can be obtained at the received word storage unit 213. Further, by inputting the address of the received word storage unit 213 to the read controller 210 for received word storage unit while incrementing the address one by one, the code word A is read out by the read controller 210 for received word storage unit and outputted as error-corrected output data.

As described above, according to the third preferred embodiment, a device for error correcting decoding can be implemented by using the device for error correcting coding of the second preferred embodiment. Therefore, in a manner similar to that of the first and second preferred embodiments, there can be provided a device for error correcting decoding which is simple in circuit configuration, as compared with the prior art device, and which has a decoding rate sufficient for practical use and is capable of decoding error correcting codes having various minimum inter-code distances without changing the circuit configuration.

MODIFICATIONS

In the above-mentioned preferred embodiments, the device for error correcting coding may be constituted as follows. That is, the device for error correcting coding of a modification is a device for error correcting coding for encoding an error correcting code for input data of natural number N bits per symbol, by using a Reed-Solomon code having elements on a Galois field GF($2^N$) having a number of elements of $2^N$, wherein the device comprises:

product data storage devices for previously storing a plurality of product data on the Galois field between each of the input data and each of coefficients of a generator polynomial of the Reed-Solomon code, with handling a plurality of b product data as one set for each address, after previously computing the plurality of product data;

first storage device comprising a natural number of m storage units each having a storage capacity of N×b bits;

read control device for controlling the product data storage device to read out the plurality of product data stored in the product data storage device in parallel by handling a plurality of b product data as one set, in response to the input data;

exclusive OR operation device having first and second input terminals each of N×b bits, the plurality of b product data read out in parallel from the product data storage device by the read control device being inputted to the first input terminal, the exclusive OR operation device computing exclusive OR data between data inputted to the first input terminal and data inputted to the second input terminal, and outputting resulting computation data;

first selecting device for controlling the first storage device to selectively and sequentially read out and output data stored in the m storage units every one storage unit thereof, to output data of more significant N×(b−1) bits out of the selectively read out and outputted data of N×b bits, to less significant N×(b−1) bits of the second input terminal of the exclusive OR operation device, and to write the resulting computation data outputted from the exclusive OR operation device into one of the m storage units by selectively and sequentially switching the m storage units; and second storage device having a storage capacity of N bits, for temporarily storing data of the less significant N bits out of the N×b bit data selectively outputted from one of the m storage units by the first selecting device, and for outputting temporarily stored data to the more significant N bits of the second input terminal of the exclusive OR operation device, wherein when sequentially inputting the input data into the product data storage device, the m storage unit of the first storage device generates parity data, wherein the device further comprises:

second selecting device for sequentially outputting the respective parity data generated by the m storage units by selectively and sequentially switching the m storage units every one storage unit in succession to the input data. In addition, in the preferred embodiments of FIG. 1 and FIG. 4, N=8, b=4 and m=3.

In the above-mentioned preferred embodiments, the ROM 14 is employed to store product data. However, the present invention is not limited to this, and the ROM 14 may be substituted by a computing device which is implemented by a logic circuit made of a combination of logic circuit elements, and which computes product data for input data.

INDUSTRIAL APPLICABILITY

According to the present invention, in a device and method for error correcting coding for encoding an error correcting code for input data of natural number N bits per symbol, by using a Reed-Solomon code having elements on a Galois field GF($2^N$) having a number of elements of $2^N$, the ROM (14) is product data storage device, after previously computing a plurality of product data on the Galois field between each of the input data and each of coefficients of a generator polynomial of the Reed-Solomon code, and the ROM (14) previously stores the plurality of product data with handling a plurality of b product data as one set for each address. The read control devices (12, 13, 24–26, 28), in response to the input data, read out the plurality of product data stored in the ROM (14) in parallel with the plurality of b product data taken as one set, and thereafter write them selectively and sequentially into the natural number m storage units (20–22) via the EOR computing units (15–18) and the bus selector (19). Input data is inputted to the ROM (14) sequentially, by which parity data are generated and outputted in the m storage units.

Accordingly, computations for the encoding process are accomplished with an arrangement that the EOR computing units (15–18) are enabled to read out 4 pieces of product data, as one set, in parallel (simultaneously) from the ROM 14 that has stored a plurality of product data, and by simultaneously processing with the four product data and by selectively and iteratively using the three 32-bit latches (20–22) in succession. As a result, the circuit configuration can be greatly simplified, as compared with the circuit configuration of the prior art device for error correcting coding of FIG. 14, while computations can be accomplished efficiently and with a high speed so that error correcting codes can be encoded at such a coding rate that the device can be put into practical use.

Furthermore, a device for error correcting decoding implemented by using the device for error correcting coding according to the present invention can be greatly simplified in circuit configuration while computations can be performed efficiently and with a high speed, so that error correcting codes can be decoded at such a decoding rate that the device can be put into practical use.

We claim:

1. A device for error correcting coding for encoding an error correcting code for input data of natural number N bits per symbol, by using a Reed-Solomon code having elements on a Galois field GF($2^N$) having a number of elements of $2^N$, said device comprising:

product data storage means for previously storing a plurality of product data on the Galois field between each of the input data and each of coefficients of a generator polynomial of the Reed-Solomon code, with handling a plurality of b product data as one set for each address, after previously computing the plurality of product data;

first storage means comprising a natural number of m storage units each having a storage capacity of N×b bits;

read control means for controlling said product data storage means to read out the plurality of product data stored in said product data storage means in parallel by handling a plurality of b product data as one set, in response to the input data;

exclusive OR operation means having first and second input terminals each of N×b bits, the plurality of b product data read out in parallel from said product data storage means by said read control means being inputted to the first input terminal, said exclusive OR operation means computing exclusive OR data between data inputted to the first input terminal and data inputted to the second input terminal, and outputting resulting computation data;

first selecting means for controlling said first storage means to selectively and sequentially read out and output data stored in said m storage units every one storage unit thereof, to output data of more significant N×(b−1) bits out of the selectively read out and outputted data of N×b bits, to less significant N×(b−1) bits of the second input terminal of said exclusive OR operation means, and to write the resulting computation data outputted from said exclusive OR operation means into one of said m storage units by selectively and sequentially switching said m storage units; and second storage means having a storage capacity of N bits, for temporarily storing data of the less significant N bits out of the N×b bit data selectively outputted from one of said m storage units by said first selecting means, and for outputting temporarily stored data to the more significant N bits of the second input terminal of said exclusive OR operation means, wherein when sequentially inputting the input data into said product data storage means, said m storage unit of said first storage means generates parity data, wherein said device further comprises:

second selecting means for sequentially outputting said respective parity data generated by said m storage units by selectively and sequentially switching the m storage units every one storage unit in succession to the input data.

2. The device for error correcting coding as claimed in claim 1, wherein said read control means, said first selecting means and said second selecting means are implemented by a central processing unit for executing a predetermined program stored in a further storage unit.

3. A device for error correcting decoding for decoding an error correcting code for input data of natural number N bits per symbol, by using a Reed-Solomon code having elements on a Galois field GF($2^N$) having a number of elements of $2^N$, said device comprising:

received word storage means for storing an input received word comprised of a plurality of received symbols including input data and parity data associated with the input data, in a unit of the received symbols;

remainder computing means comprising said device for error correcting coding as claimed in claim 1, said remainder computing means computing and outputting a remainder for the input received word by using a generator polynomial of the Reed Solomon code;

error numerical value and error position computing means for computing and outputting a set of an error position in the received word and an error numerical value corresponding to the error position, based on the remainder outputted from said remainder computing means;

control means for reading out from said received word storage means and outputting a received symbol in the error position stored in said received word storage means based on the error position in the received word outputted from said error numerical value and error position computing means;

exclusive OR operation means for computing exclusive OR data between the received symbol in the error position outputted from said read control means and the error numerical value corresponding to the error position outputted from said error numerical value and error position computing means, and outputting resulting computation data; and write control means for writing the resulting computation data outputted from said exclusive OR operation means into the error position in said received word storage means, and for correcting the received symbol in the error position.

4. A method for error correcting coding for encoding an error correcting code for input data of natural number N bits per symbol, by using a Reed-Solomon code having elements on a Galois field GF($2^N$) having a number of elements of $2^N$, said method comprising the following steps of:

previously storing in product data storage means a plurality of product data on the Galois field between each of the input data and each of coefficients of a generator polynomial of the Reed-Solomon code, with handling a plurality of b product data as one set for each address, after previously computing the plurality of product data;

controlling the product data storage means to read out the plurality of product data stored in the product data storage means in parallel by handling a plurality of b product data as one set, in response to the input data;

by using an exclusive OR operation means having first and second input terminals each of N×b bits, the plurality of b product data read out in parallel from the product data storage means by the read control means being inputted to the first input terminal, computing exclusive OR data between data inputted to the first input terminal and data inputted to the second input terminal, and outputting resulting computation data;

controlling the first storage means comprising m storage unit each having a storage capacity of N×b bits, to selectively and sequentially read out and output data stored in the m storage units every one storage unit thereof, to output data of more significant N×(b−1) bits out of the selectively read out and outputted data of N×b bits, to less significant N×(b−1) bits of the second input terminal of the exclusive OR operation means, and to write the resulting computation data outputted from the exclusive OR operation means into one of the m storage units by selectively and sequentially switching the m storage units;

by using second storage means having a storage capacity of N bits, temporarily storing data of the less significant N bits out of the N×b bit data selectively outputted from one of the m storage units, and outputting temporarily stored data to the more significant N bits of the second input terminal of the exclusive OR operation means;

when sequentially inputting the input data into the product data storage means, generating parity data in the m storage unit of the first storage means; and sequentially outputting the respective parity data generated by the m storage units by selectively and sequentially switching the m storage units every one storage unit in succession to the input data.

5. A method for error correcting decoding for decoding an error correcting code for input data of natural number N bits per symbol, by using a Reed-Solomon code having elements on a Galois field GF($2^N$) having a number of elements of $2^N$, said method comprising the following steps of:

storing in received word storage means an input received word comprised of a plurality of received symbols including input data and parity data associated with the input data, in a unit of the received symbols;

by said method for error correcting coding as claimed in claim 4, computing and outputting a remainder for the input received word by using a generator polynomial of the Reed Solomon code;

computing and outputting a set of an error position in the received word and an error numerical value corresponding to the error position, based on the outputted remainder;

reading out from the received word storage means and outputting a received symbol in the error position stored in the received word storage means based on the error position in the outputted received word;

computing exclusive OR data between the received symbol in the outputted error position and the error numerical value corresponding to the outputted error position, and outputting resulting computation data; and writing the outputted resulting computation data into the error position in the received word storage means, and correcting the received symbol in the error position.

* * * * *